US012707674B2

(12) United States Patent
Kimoto et al.

(10) Patent No.: US 12,707,674 B2
(45) Date of Patent: Aug. 11, 2026

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Shinichi Kimoto, Tsukuba (JP); Shinya Kyogoku, Yokohama (JP); Ryosuke Iijima, Setagaya (JP); Shinsuke Harada, Tsukuba (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 1015 days.

(21) Appl. No.: 17/824,000

(22) Filed: Sep. 1, 2022

(65) Prior Publication Data

US 2023/0317844 A1 Oct. 5, 2023

(30) Foreign Application Priority Data

Mar. 17, 2022 (JP) ................................ 2022-042732

(51) Int. Cl.
*H10D 30/66* (2025.01)
*H10D 62/832* (2025.01)

(52) U.S. Cl.
CPC ....... *H10D 30/668* (2025.01); *H10D 62/8325* (2025.01)

(58) Field of Classification Search
CPC .................................................. H10D 30/668
See application file for complete search history.

(56) References Cited

U.S. PATENT DOCUMENTS

| | | | | |
|---|---|---|---|---|
| 9,741,797 | B2 | 8/2017 | Kagawa et al. | |
| 2019/0058060 | A1* | 2/2019 | Saito .................... | H10D 64/513 |

(Continued)

FOREIGN PATENT DOCUMENTS

| | | | |
|---|---|---|---|
| JP | 2019-195081 | A | 11/2019 |
| JP | 2020-17641 | A | 1/2020 |

(Continued)

*Primary Examiner* — Minsun O Harvey
*Assistant Examiner* — Stephen Sutton Kotter
(74) *Attorney, Agent, or Firm* — Oblon, McClelland, Maier & Neustadt, L.L.P.

(57) ABSTRACT

A semiconductor device of embodiments includes: a silicon carbide layer having a first face and a second face parallel to a first direction and a second direction perpendicular to the first direction; a first trench, a second trench, and a third trench extending in the first direction; a first region of n-type disposed in the silicon carbide layer; a second region of p-type disposed in the silicon carbide layer, disposed between the first region of n-type and the first face, and disposed between the first trench and the second trench; a sixth region of p-type disposed in the silicon carbide layer and disposed on a bottom surface of the first trench; a seventh region of p-type disposed in the silicon carbide layer and disposed on a bottom surface of the second trench; an eighth region of p-type disposed in the silicon carbide layer and disposed on a bottom surface of the third trench; a ninth region of p-type disposed in the silicon carbide layer and in contact with the sixth region and the second region; and a tenth region of p-type disposed in the silicon carbide layer and in contact with the seventh region and the second region. At a cross section perpendicular to the first direction and including the ninth region and the tenth region, the first region is in contact with a side surface of the first trench on the third trench side and a side surface of the third trench on the first trench side.

18 Claims, 19 Drawing Sheets

(56) References Cited

U.S. PATENT DOCUMENTS

| | | | | |
|---|---|---|---|---|
| 2019/0348524 | A1* | 11/2019 | Ebiike | H10D 30/668 |
| 2020/0035791 | A1 | 1/2020 | Oshima et al. | |
| 2021/0036102 | A1* | 2/2021 | Kyogoku | H10D 12/031 |
| 2021/0288156 | A1* | 9/2021 | Fukui | H10D 64/64 |
| 2023/0080779 | A1 | 3/2023 | Kimoto et al. | |
| 2023/0215942 | A1* | 7/2023 | Tanaka | H10D 84/0126 |

FOREIGN PATENT DOCUMENTS

| | | | |
|---|---|---|---|
| JP | 2020-38995 | A | 3/2020 |
| JP | 2020-77824 | A | 5/2020 |
| JP | 2023-43336 | A | 3/2023 |
| WO | WO 2023/166657 | A1 | 9/2023 |

* cited by examiner

FIG.3

BB' CROSS SECTION
SECOND DIRECTION
THIRD DIRECTION
100
56
43
56
43
56
43
56
53d
32
33
53b
53b
12
13
53a
53a
22
23
53c
41
F1
p+
n+
n+
p+
n+
n+
p+
n+
n+
p+
p
p
p
p
31a
31b
11a
11b
21a
21b
Fx
p+
p+
p+
p+
p+
p+
10
52d
54c
31
31c
55d
52b
55c
54a
11
11c
52a
54b
21
21c
55e
52c
51
n−
n+
50
F2
42

DD' CROSS SECTION
SECOND DIRECTION
THIRD DIRECTION
900
32
33
12
13
22
23
41
p+
n+
p
31a
31b
11a
11b
21a
21b
52
54
55
31
11
21
11c
10
X
Y
51
n−
n+
50
42

AA' CROSS SECTION
SECOND DIRECTION
THIRD DIRECTION
100
32
33
12
13
22
23
41
p+
n+
p
31a
31b
11a
11b
21a
21b
52
54
31
11
11c
55
21
10
X
Y
51
n−
n+
50
42

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2022-042732, filed on Mar. 17, 2022, the entire contents of which are incorporated herein by reference.

FIELD

Embodiments described herein relate generally to a semiconductor device, an inverter circuit, a drive device, a vehicle, and an elevator.

BACKGROUND

Silicon carbide (Sic) is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such physical properties, it is possible to realize a semiconductor device that can operate at high temperature with low loss.

In a metal oxide semiconductor field effect transistor (MOSFET) using silicon carbide, it is required to reduce the on-resistance.

BRIEF DESCRIPTION OF THE DRAWINGS

FIG. 3 is a schematic cross-sectional view of the semiconductor device according to the first embodiment;

DETAILED DESCRIPTION

Figure 1:
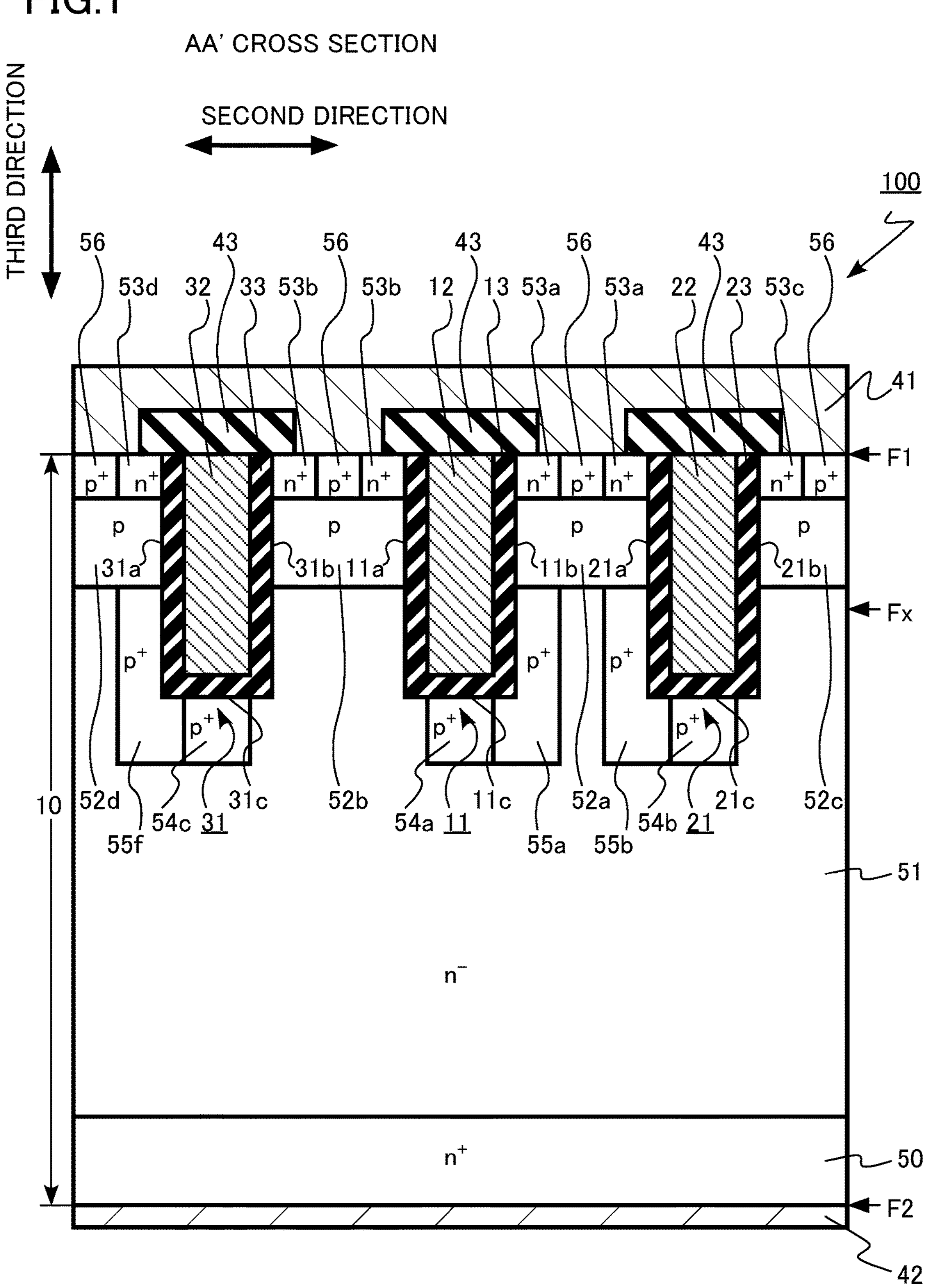
FIG. 1 is a schematic cross-sectional view of a semiconductor device according to a first embodiment.

A semiconductor device of embodiments includes: a silicon carbide layer having a first face parallel to a first direction and a second direction perpendicular to the first direction and a second face parallel to the first face; a first trench disposed in the silicon carbide layer, extending in the first direction on the first face, and having a first side surface, a second side surface, and a first bottom surface between the first side surface and the second side surface; a first gate electrode disposed in the first trench; a first gate insulating layer disposed between the first gate electrode and the silicon carbide layer; a second trench disposed in the silicon carbide layer, extending in the first direction on the first face, and having a third side surface facing the second side surface, a fourth side surface, and a second bottom surface between the third side surface and the fourth side surface; a second gate electrode disposed in the second trench; a second gate insulating layer disposed between the second gate electrode and the silicon carbide layer; a third trench disposed in the silicon carbide layer, extending in the first direction on the first face, and having a fifth side surface, a sixth side surface facing the first side surface, and a third bottom surface between the fifth side surface and the sixth side surface, the first trench being disposed between the second trench and the third trench; a third gate electrode disposed in the third trench; a third gate insulating layer disposed between the third gate electrode and the silicon carbide layer; a first silicon carbide region of n-type disposed in the silicon carbide layer; a second silicon carbide region of p-type disposed in the silicon carbide layer, disposed between the first silicon carbide region and the first face, and disposed between the first trench and the second trench; a third silicon carbide region of p-type disposed in the silicon carbide layer, disposed between the first silicon carbide region and the first face, and disposed between the first trench and the third trench; a fourth silicon carbide region of n-type disposed in the silicon carbide layer and disposed between the second silicon carbide region and the first face; a fifth silicon carbide region of n-type disposed in the silicon carbide layer and disposed between the third silicon carbide region and the first face; a sixth silicon carbide region of p-type disposed in the silicon carbide layer and disposed between the first silicon carbide region and the first bottom surface; a seventh silicon carbide region of p-type disposed in the silicon carbide layer and disposed between the first silicon carbide region and the second bottom surface; an eighth silicon carbide region of p-type disposed in the silicon carbide layer and disposed between the first silicon carbide region and the third bottom surface; a plurality of ninth silicon carbide regions of p-type disposed in the silicon carbide layer, in contact with the sixth silicon carbide region, in contact with the second silicon carbide region, in contact with the second side surface, and repeatedly arranged in the first direction; and a plurality of tenth silicon carbide regions of p-type disposed in the silicon carbide layer, in contact with the seventh silicon carbide region, in contact with the second silicon carbide region, in contact with the third side surface, and repeatedly arranged in the first direction. At a first cross section perpendicular to the first face, perpendicular to the first direction, and including one of the ninth silicon carbide regions and one of the tenth silicon carbide regions, the first silicon carbide region is in contact with the first side surface and the sixth side surface.

Hereinafter, embodiments will be described with reference to the diagrams. In the following description, the same or similar members and the like will be denoted by the same reference numerals, and the description of the members and the like once described will be omitted as appropriate.

In addition, in the following description, when the notations of $n^+$, n, $n^-$, $p^+$, p, and $p^-$ are used, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image.

The width of a trench, the distance between trenches, the depth of a trench, the thickness of an insulating layer, and the like can be measured, for example, on an image of SIMS or transmission electron microscope (TEM).

First Embodiment

A semiconductor device according to a first embodiment includes: a silicon carbide layer having a first face parallel to a first direction and a second direction perpendicular to the first direction and a second face parallel to the first face; a first trench disposed in the silicon carbide layer, extending in the first direction on the first face, and having a first side surface, a second side surface, and a first bottom surface between the first side surface and the second side surface; a first gate electrode disposed in the first trench; a first gate insulating layer disposed between the first gate electrode and the silicon carbide layer; a second trench disposed in the silicon carbide layer, extending in the first direction on the first face, and having a third side surface facing the second side surface, a fourth side surface, and a second bottom surface between the third side surface and the fourth side surface; a second gate electrode disposed in the second trench; a second gate insulating layer disposed between the second gate electrode and the silicon carbide layer; a third trench disposed in the silicon carbide layer, extending in the first direction on the first face, and having a fifth side surface, a sixth side surface facing the first side surface, and a third bottom surface between the fifth side surface and the sixth side surface, the first trench being disposed between the second trench and the third trench; a third gate electrode disposed in the third trench; a third gate insulating layer disposed between the third gate electrode and the silicon carbide layer; a first silicon carbide region of n-type disposed in the silicon carbide layer; a second silicon carbide region of p-type disposed in the silicon carbide layer, disposed between the first silicon carbide region and the first face, and disposed between the first trench and the second trench; a third silicon carbide region of p-type disposed in the silicon carbide layer, disposed between the first silicon carbide region and the first face, and disposed between the first trench and the third trench; a fourth silicon carbide region of n-type disposed in the silicon carbide layer and disposed between the second silicon carbide region and the first face; a fifth silicon carbide region of n-type disposed in the silicon carbide layer and disposed between the third silicon carbide region and the first face; a sixth silicon carbide region of p-type disposed in the silicon carbide layer and disposed between the first silicon carbide region and the first bottom surface; a seventh silicon carbide region of p-type disposed in the silicon carbide layer and disposed between the first silicon carbide region and the second bottom surface; an eighth silicon carbide region of p-type disposed in the silicon carbide layer and disposed between the first silicon carbide region and the third bottom surface; a plurality of ninth silicon carbide regions of p-type disposed in the silicon carbide layer, in contact with the sixth silicon carbide region, in contact with the second silicon carbide region, in contact with the second side surface, and repeatedly arranged in the first direction; and a plurality of tenth silicon carbide regions of p-type disposed in the silicon carbide layer, in contact with the seventh silicon carbide region, in contact with the second silicon carbide region, in contact with the third side surface, and repeatedly arranged in the first direction. At a first cross section perpendicular to the first face, perpendicular to the first direction, and including one of the ninth silicon carbide regions and one of the tenth silicon carbide regions, the first silicon carbide region is in contact with the first side surface and the sixth side surface.

FIG. 1 is a schematic cross-sectional view of the semiconductor device according to the first embodiment. The semiconductor device according to the first embodiment is a trench gate type vertical MOSFET 100 using silicon carbide. The MOSFET 100 is an n-channel MOSFET having electrons as carriers.

Figure 2:
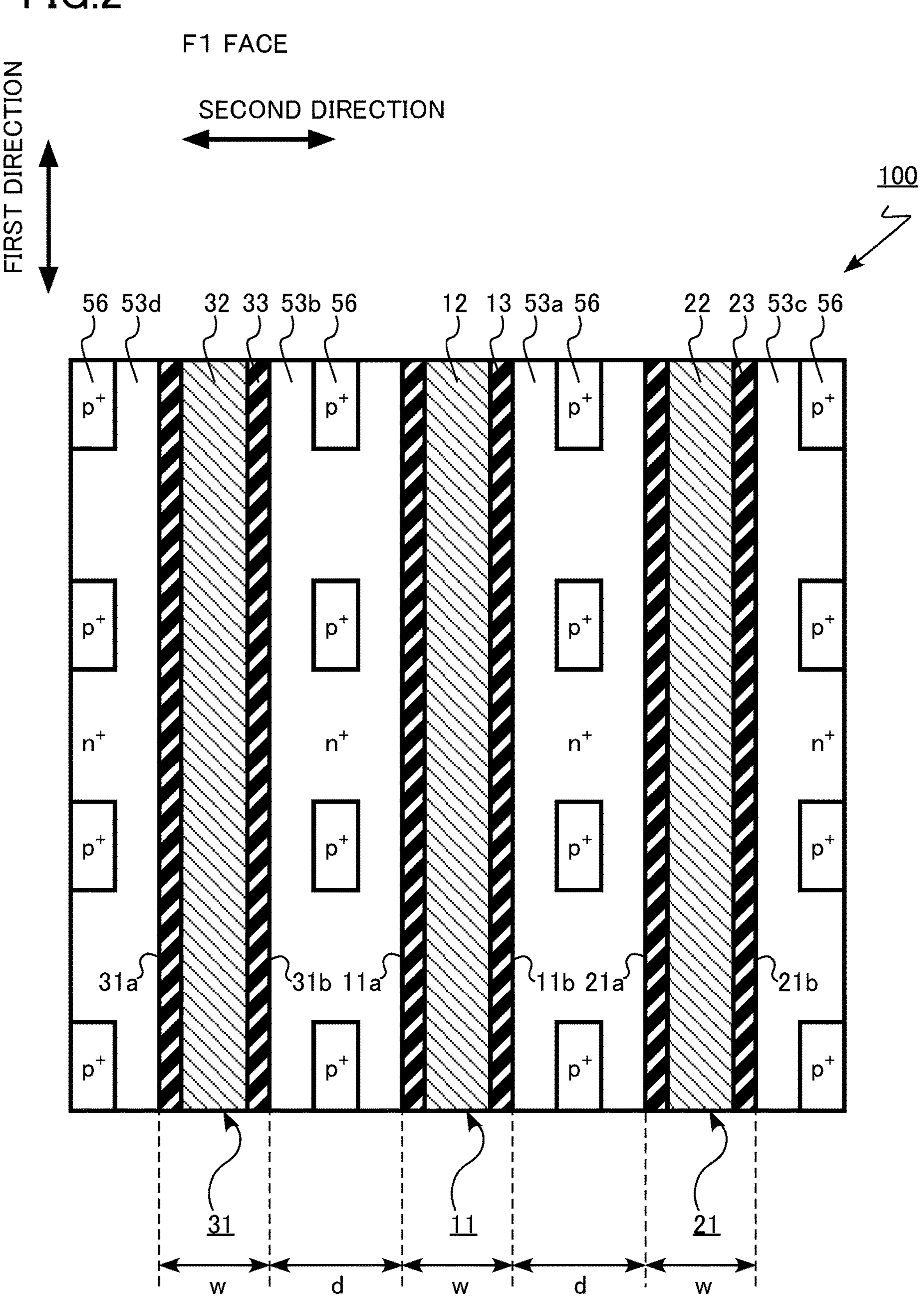
FIG. 2 is a schematic plan view of the semiconductor device according to the first embodiment.

FIG. 2 is a schematic plan view of the semiconductor device according to the first embodiment. FIG. 2 is a plan view of a first face (F1 in FIG. 1) in FIG. 1. The first direction and the second direction are directions parallel to the first face F1. In addition, the second direction is a direction perpendicular to the first direction.

Figure 3:
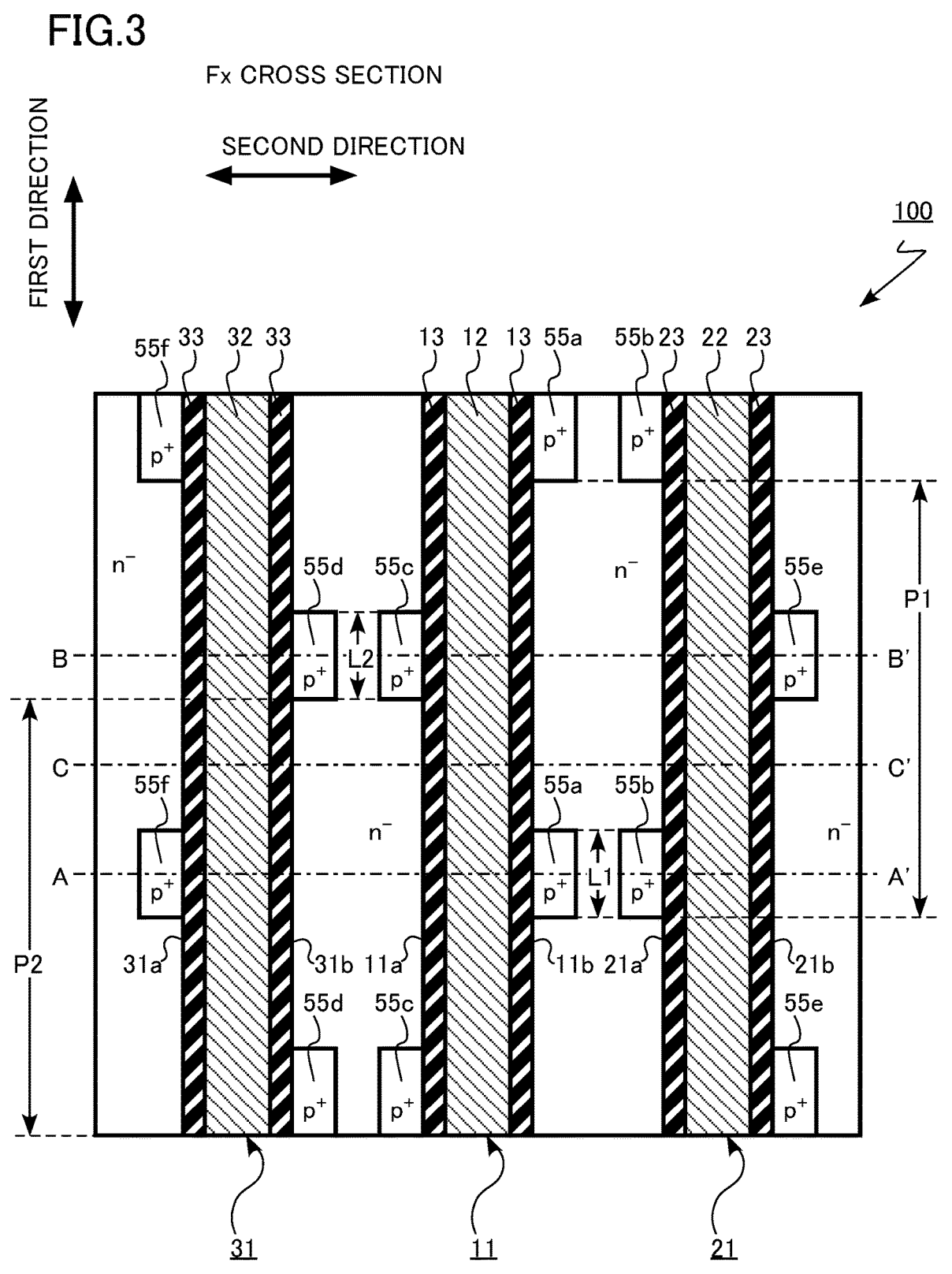

FIG. 3 is a schematic cross-sectional view of the semiconductor device according to the first embodiment. FIG. 3 shows a cross section taken along Fx of FIG. 1. FIG. 3 shows a cross section parallel to the first direction and the second direction. FIG. 3 shows a cross section parallel to the first face F1. FIG. 1 is a cross-sectional view taken along the line AA' of FIG. 3. The AA' cross section is an example of the first cross section.

Figure 4:
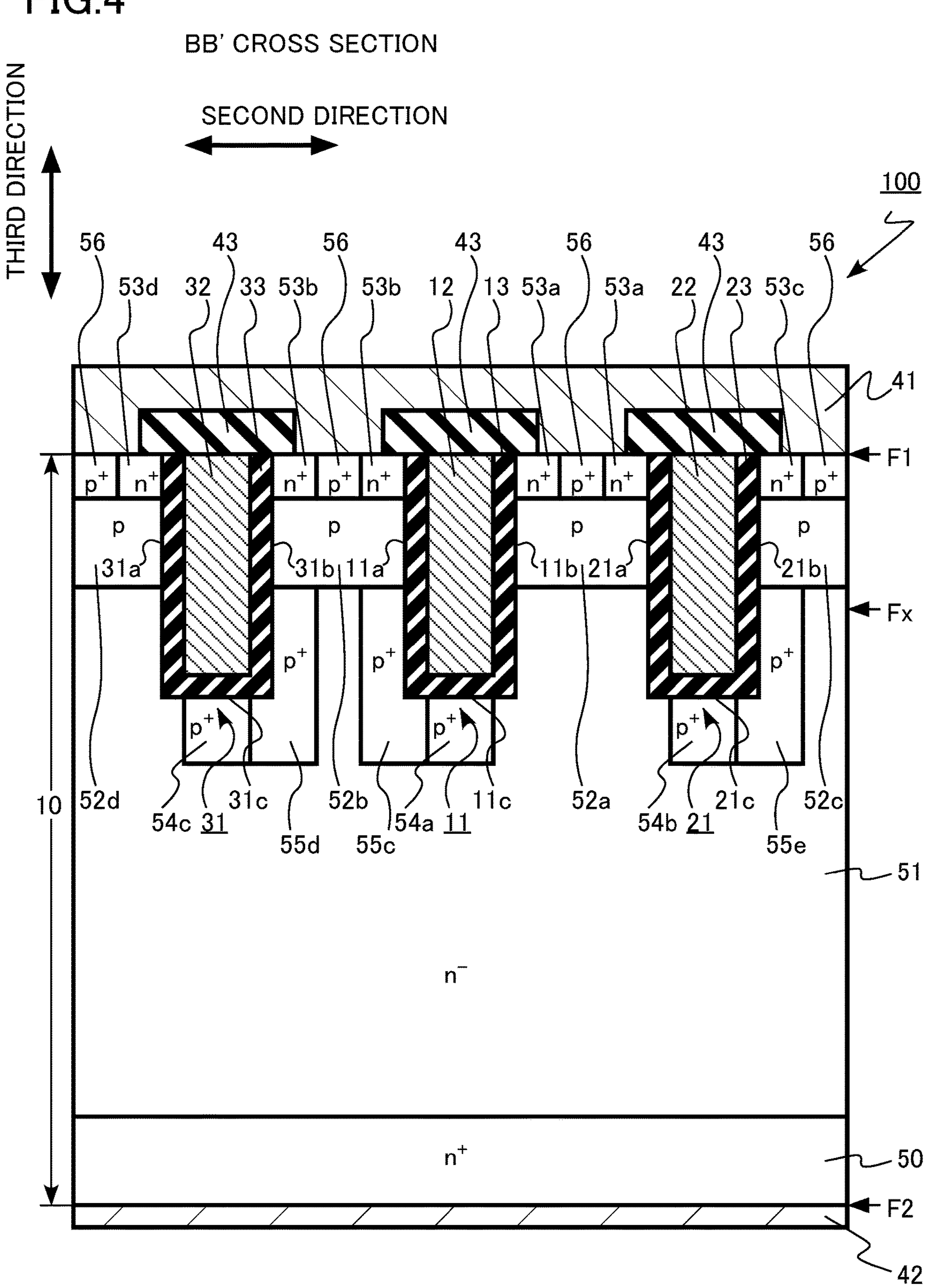
FIG. 4 is a schematic cross-sectional view of the semiconductor device according to the first embodiment.

FIG. 4 is a schematic cross-sectional view of the semiconductor device according to the first embodiment. FIG. 4 is a cross-sectional view taken along the line BB' of FIG. 3. The BB' cross section is an example of the second cross section.

Figure 5:
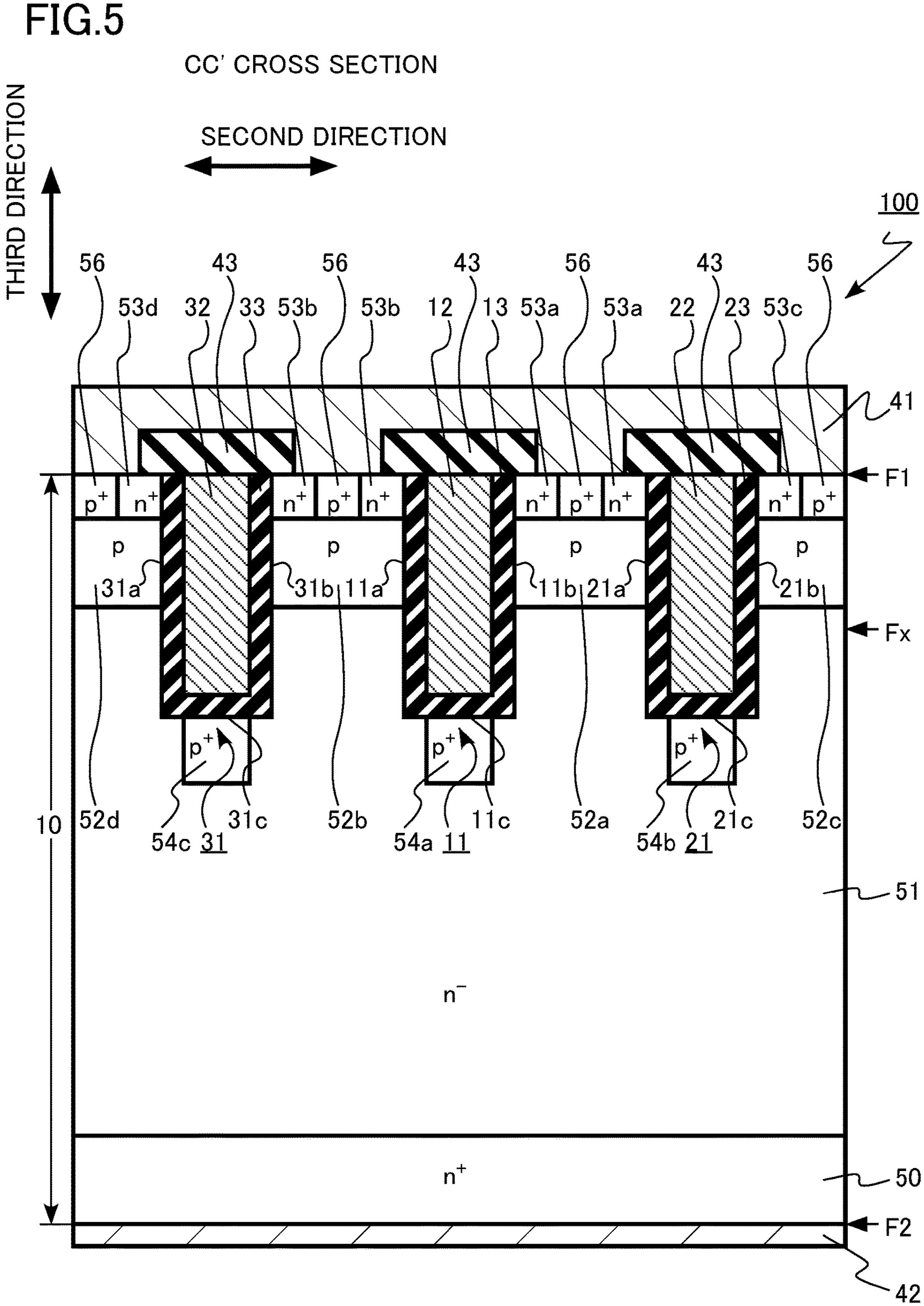
FIG. 5 is a schematic cross-sectional view of the semiconductor device according to the first embodiment.

FIG. 5 is a schematic cross-sectional view of the semiconductor device according to the first embodiment. FIG. 5 is a cross-sectional view taken along the line CC' of FIG. 3.

The MOSFET 100 includes a silicon carbide layer 10, a first trench 11, a first gate electrode 12, a first gate insulating layer 13, a second trench 21, a second gate electrode 22, a second gate insulating layer 23, a third trench 31, a third gate electrode 32, a third gate insulating layer 33, a source electrode 41, a drain electrode 42, and an interlayer insulating layer 43.

Hereinafter, the first trench 11, the second trench 21, and the third trench 31 may be collectively referred to as a trench. In addition, the first gate electrode 12, the second gate electrode 22, and the third gate electrode 32 may be collectively referred to as a gate electrode. In addition, the first gate insulating layer 13, the second gate insulating layer 23, and the third gate insulating layer 33 may be collectively referred to as a gate insulating layer.

In the silicon carbide layer 10, an $n^+$-type drain region 50, an $n^-$-type drift region 51 (first silicon carbide region), a first body region 52*a* of p-type (second silicon carbide region), a second body region 52*b* of p-type (third silicon carbide region), a third body region 52*c* of p-type, a fourth body region 52*d* of p-type, a first source region 53*a* of $n^+$-type (fourth silicon carbide region), a second source region 53*b* of $n^+$-type (fifth silicon carbide region), a third source region 53*c* of $n^+$-type, a fourth source region 53*d* of $n^+$-type, a first electric field relaxation region 54*a* of p'-type (sixth silicon carbide region), a second electric field relaxation region 54*b* of $p^+$-type (seventh silicon carbide region), a third electric field relaxation region 54*c* of $p^+$-type (eighth silicon carbide region), a first connection region 55*a* of $p^+$-type (ninth silicon carbide region), a second connection region 55*b* of $p^+$-type (tenth silicon carbide region), a third connection region 55*c* of $p^+$-type (eleventh silicon carbide region), a fourth connection region 55*d* of $p^+$-type (twelfth silicon carbide region), a fifth connection region 55*e* of pt-type, a sixth connection region 55*f* of pt-type, and a pt-type contact region 56 are provided.

Hereinafter, the first body region 52*a*, the second body region 52*b*, the third body region 52*c* of p-type, and the fourth body region 52*d* may be collectively referred to as a body region 52. In addition, the first source region 53*a*, the second source region 53*b*, the third source region 53*c*, and the fourth source region 53*d* may be collectively referred to as a source region 53. In addition, the first electric field relaxation region 54*a*, the second electric field relaxation region 54*b*, and the third electric field relaxation region 54*c* may be collectively referred to as an electric field relaxation region 54. In addition, the first connection region 55*a*, the second connection region 55*b*, the third connection region 55*c*, the fourth connection region 55*d*, the fifth connection region 55*e*, and the sixth connection region 55*f* may be collectively referred to as a connection region 55.

The silicon carbide layer 10 is a single crystal SiC. The silicon carbide layer 10 is, for example, 4H—SiC.

The silicon carbide layer 10 includes a first face ("F1" in FIG. 1) and a second face ("F2" in FIG. 1). The first face F1 and the second face F2 face each other. Hereinafter, the first face F1 is also referred to as a surface, and the second face F2 is also referred to as a back surface. In addition, hereinafter, the "depth" means a depth in a direction toward the second face F2 with the first face F1 as a reference.

In FIGS. 1 to 5, the first direction and the second direction are parallel to the first face F1 and the second face F2. The third direction is perpendicular to the first face F1 and the second face F2.

The first face F1 is, for example, a face inclined by an angle equal to or more than 0° and equal to or less than 8° with respect to the (0001) face. That is, the first face F1 is a face whose normal is inclined by an angle equal to or more than 0° and equal to or less than 8° with respect to the c axis in the [0001] direction. In other words, an off angle with respect to the (0001) face is equal to or more than 0° and equal to or less than 8°. In addition, the second face F2 is, for example, a face inclined by an angle equal to or more than 0° and equal to or less than 8° with respect to the (000-1) face.

The (0001) face is referred to as a silicon face. The (000-1) face is referred to as a carbon face. The inclination direction of the first face F1 and the second face F2 is, for example, a [11-20] direction. The [11-20] direction is an a-axis direction. In FIG. 1, for example, the second direction shown in the diagram is the a-axis direction.

The first trench 11, the second trench 21, and the third trench 31 are disposed in the silicon carbide layer 10. The first trench 11, the second trench 21, and the third trench 31 extend in the first direction as shown in FIG. 2.

The widths (w in FIG. 2) of the first trench 11, the second trench 21, and the third trench 31 in the second direction are smaller than, for example, a distance (d in FIG. 2) between the first trench 11 and the second trench 21 and a distance (d in FIG. 2) between the first trench 11 and the third trench 31.

The widths (w in FIG. 2) of the first trench 11, the second trench 21, and the third trench 31 in the second direction are, for example, equal to or more than 0.3 μm and equal to or less than 1 μm. The distance (d in FIG. 2) between the first trench 11 and the second trench 21 and the distance (d in FIG. 2) between the first trench 11 and the third trench 31 are, for example, equal to or more than 0.5 μm and equal to or less than 2 μm. The depths of the first trench 11, the second trench 21, and the third trench 31 are, for example, equal to or more than 1 μm and equal to or less than 2 μm.

A plurality of trenches including the first trench 11, the second trench 21, and the third trench 31 are repeatedly arranged in the second direction. The repetition pitch of the trenches in the second direction is, for example, equal to or more than 1 μm and equal to or less than 5 μm.

The first trench 11 is disposed between the second trench 21 and the third trench 31.

The first trench 11 has a first side surface 11*a*, a second side surface 11*b*, and a first bottom surface 11*c*. The first bottom surface 11*c* is provided between the first side surface 11*a* and the second side surface 11*b*.

The first gate electrode 12 is provided in the first trench 11. The first gate electrode 12 is provided between the source electrode 41 and the drain electrode 42. The first gate electrode 12 extends in the first direction.

The first gate insulating layer 13 is provided between the first gate electrode 12 and the silicon carbide layer 10. The first gate insulating layer 13 is provided between the first gate electrode 12 and each of the first source region 53*a*, the second source region 53*b*, the first body region 52*a*, the second body region 52*b*, the first electric field relaxation region 54*a*, the first connection region 55*a*, and the third connection region 55*c*.

The second trench 21 has a third side surface 21*a*, a fourth side surface 21*b*, and a second bottom surface 21*c*. The second bottom surface 21*c* is provided between the third side surface 21*a* and the fourth side surface 21*b*. The third side surface 21*a* faces the second side surface 11*b*.

The second gate electrode 22 is provided in the second trench 21. The second gate electrode 22 is provided between the source electrode 41 and the drain electrode 42. The second gate electrode 22 extends in the first direction.

The second gate insulating layer 23 is provided between the second gate electrode 22 and the silicon carbide layer 10. The second gate insulating layer 23 is provided between the second gate electrode 22 and each of the first source region

53*a*, the third source region 53*c*, the first body region 52*a*, the third body region 52*c*, the second electric field relaxation region 54*b*, the second connection region 55*b*, and the fifth connection region 55*e*.

The third trench 31 has a fifth side surface 31*a*, a sixth side surface 31*b*, and a third bottom surface 31*c*. The third bottom surface 31*c* is provided between the fifth side surface 31*a* and the sixth side surface 31*b*. The sixth side surface 31*b* faces the first side surface 11*a*.

The third gate electrode 32 is provided in the third trench 31. The third gate electrode 32 is provided between the source electrode 41 and the drain electrode 42. The third gate electrode 32 extends in the first direction.

The third gate insulating layer 33 is provided between the third gate electrode 32 and the silicon carbide layer 10. The third gate insulating layer 33 is provided between the third gate electrode 32 and each of the second source region 53*b*, the fourth source region 53*d*, the second body region 52*b*, the fourth body region 52*d*, the third electric field relaxation region 54*c*, the fourth connection region 55*d*, and the sixth connection region 55*f*.

The first gate electrode 12, the second gate electrode 22, and the third gate electrode 32 are conductive layers. The first gate electrode 12, the second gate electrode 22, and the third gate electrode 32 are, for example, polycrystalline silicon containing p-type impurities or n-type impurities.

The first gate insulating layer 13, the second gate insulating layer 23, and the third gate insulating layer 33 are, for example, silicon oxide films. For example, a High-k insulating film (high dielectric constant insulating film, such as HfSiON, ZrSiON, and AlON) can be applied to the first gate insulating layer 13, the second gate insulating layer 23, and the third gate insulating layer 33. In addition, for example, a stacked film of a silicon oxide film ($SiO_2$) and a High-k insulating film can also be applied to the first gate insulating layer 13, the second gate insulating layer 23, and the third gate insulating layer 33.

The interlayer insulating layer 43 is provided on the first gate electrode 12, the second gate electrode 22, and the third gate electrode 32. The interlayer insulating layer 43 is, for example, a silicon oxide film.

The source electrode 41 is provided on the surface side of the silicon carbide layer 10. The source electrode 41 is provided on the surface of the silicon carbide layer 10. The source electrode 41 is electrically connected to the body region 52, the source region 53, and the contact region 56. The source electrode 41 is in contact with the source region 53 and the contact region 56.

The source electrode 41 contains metal. The metal forming the source electrode 41 is, for example, a stacked structure of titanium (Ti) and aluminum (Al). The source electrode 41 may contain a metal silicide or a metal carbide in contact with the silicon carbide layer 10.

The drain electrode 42 is provided on the back surface side of the silicon carbide layer 10. The drain electrode 42 is provided on the back surface of the silicon carbide layer 10. The drain electrode 42 is in contact with the drain region 50.

The drain electrode 42 is, for example, a metal or a metal semiconductor compound. The drain electrode 42 contains a material selected from a group consisting of nickel silicide (NiSi), titanium (Ti), nickel (Ni), silver (Ag), and gold (Au), for example.

The n'-type drain region 50 is provided on the back surface side of the silicon carbide layer 10. The drain region 50 contains, for example, nitrogen (N) as an n-type impurity. The n-type impurity concentration in the drain region 50 is, for example, equal to or more than $1\times10^{18}$ $cm^{-3}$ and equal to or less than $1\times10^{21}$ $cm^{-3}$.

The n'-type drift region 51 is provided on the drain region 50. The drift region 51 is provided between the drain region 50 and the surface of the silicon carbide layer 10.

The drift region 51 contains, for example, nitrogen (N) as an n-type impurity. The n-type impurity concentration in the drift region 51 is, for example, equal to or more than $4\times10^{14}$ $cm^{-3}$ and equal to or less than $1\times10^{18}$ $cm^{-3}$. The thickness of the drift region 51 in the third direction is, for example, equal to or more than 4 μm and equal to or less than 150 μm.

The first body region 52*a* of p-type is provided between the drift region 51 and the surface of the silicon carbide layer 10. The first body region 52*a* is provided between the first trench 11 and the second trench 21. The first body region 52*a* is in contact with the second side surface 11*b* and the third side surface 21*a*.

The second body region 52*b* of p-type is provided between the drift region 51 and the surface of the silicon carbide layer 10. The second body region 52*b* is provided between the first trench 11 and the third trench 31. The second body region 52*b* is in contact with the first side surface 11*a* and the sixth side surface 31*b*.

The body region 52 functions as a channel region of the MOSFET 100. For example, when the MOSFET 100 is turned on, a channel through which electrons flow is formed in a region of the body region 52 in contact with the gate insulating layer.

The body region 52 contains, for example, aluminum (Al) as a p-type impurity. The p-type impurity concentration in the body region 52 is, for example, equal to or more than $5\times10^{16}$ $cm^{-3}$ and equal to or less than $5\times10^{17}$ $cm^{-3}$. The depth of the body region 52 is, for example, equal to or more than 0.2 μm and equal to or less than 1.0 μm.

The first source region 53*a* of $n^+$-type is provided between the first body region 52*a* and the surface of the silicon carbide layer 10. The first source region 53*a* is in contact with the source electrode 41. The first source region 53*a* is in contact with the first gate insulating layer 13 and the second gate insulating layer 23. The first source region 53*a* is in contact with the second side surface 11*b* and the third side surface 21*a*.

The second source region 53*b* of $n^+$-type is provided between the second body region 52*b* and the surface of the silicon carbide layer 10. The second source region 53*b* is in contact with the source electrode 41. The second source region 53*b* is in contact with the first gate insulating layer 13 and the third gate insulating layer 33. The second source region 53*b* is in contact with the first side surface 11*a* and the sixth side surface 31*b*.

The n-type impurity concentration in the source region 53 is, for example, equal to or more than $1\times10^{19}$ $cm^{-3}$ and equal to or less than $1\times10^{21}$ $cm^{-3}$. The depth of the source region 53 is shallower than the depth of the body region 52, for example, equal to or more than 0.1 μm and equal to or less than 0.3 μm. The distance between the drift region 51 and the source region 53 is, for example, equal to or more than 0.1 μm and equal to or less than 0.9 μm.

The $p^+$-type contact region 56 is provided between the body region 52 and the surface of the silicon carbide layer 10. The contact region 56 is in contact with the source electrode 41. The contact region 56 is repeatedly arranged in the first direction.

The contact region 56 contains, for example, aluminum (Al) as a p-type impurity. The p-type impurity concentration in the contact region 56 is, for example, higher than the p-type impurity concentration in the body region 52.

The p-type impurity concentration in the contact region 56 is, for example, equal to or more than $1\times10^{18}$ $cm^{-3}$ and equal to or less than $1\times10^{21}$ $cm^{-3}$. In addition, a portion of the contact region 56 in contact with the source electrode 41 preferably has a high concentration, which is, for example, equal to or more than $1\times10^{19}$ $cm^{-3}$ and equal to or less than $1\times10^{21}$ $cm^{-3}$.

The first electric field relaxation region 54*a* of $p^+$-type is provided between the drift region 51 and the first trench 11. The first electric field relaxation region 54*a* is provided between the drift region 51 and the first bottom surface 11*c*. The first electric field relaxation region 54*a* is in contact with the first bottom surface 11*c*.

The second electric field relaxation region 54*b* of $p^+$-type is provided between the drift region 51 and the second trench 21. The second electric field relaxation region 54*b* is provided between the drift region 51 and the second bottom surface 21*c*. The second electric field relaxation region 54*b* is in contact with the second bottom surface 21*c*.

The third electric field relaxation region 54*c* of $p^+$-type is provided between the drift region 51 and the third trench 31. The third electric field relaxation region 54*c* is provided between the drift region 51 and the third bottom surface 31*c*. The third electric field relaxation region 54*c* is in contact with the third bottom surface 31*c*.

The electric field relaxation region 54 contains, for example, aluminum (Al) as a p-type impurity. The p-type impurity concentration in the electric field relaxation region 54 is, for example, higher than the p-type impurity concentration in the body region 52. The p-type impurity concentration in the electric field relaxation region 54 is, for example, equal to or more than $1\times10^{17}$ $cm^{-3}$ and equal to or less than $1\times10^{20}$ $cm^{-3}$.

The electric field relaxation region 54 can be formed, for example, by forming a trench in the silicon carbide layer 10 and then ion-implanting aluminum (Al) into the silicon carbide layer 10 from the bottom surface of the trench.

The electric potential of the electric field relaxation region 54 is fixed to the electric potential of the source electrode 41. The electric potential of the electric field relaxation region 54 is fixed to the source electric potential. The electric field relaxation region 54 has a function of relaxing the electric field applied to the gate insulating layer at the bottom of the trench.

The first connection region 55*a* of $p^+$-type is in contact with the first electric field relaxation region 54*a*. In addition, the first connection region 55*a* is in contact with the first body region 52*a*. The first connection region 55*a* is in contact with the second side surface 11*b* of the first trench 11.

The first connection region 55*a* is repeatedly arranged in the first direction. The first connection region 55*a* is repeatedly arranged at a first repetition pitch (P1 in FIG. 3) in the first direction.

The length (L1 in FIG. 3) of the first connection region 55*a* in the first direction is, for example, equal to or more than 0.5 μm and equal to or less than 3 μm.

The second connection region 55*b* of $p^+$-type is in contact with the second electric field relaxation region 54*b*. In addition, the second connection region 55*b* is in contact with the first body region 52*a*. The second connection region 55*b* is in contact with the third side surface 21*a* of the second trench 21.

The second connection region 55*b* is repeatedly arranged in the first direction. The second connection region 55*b* is arranged at the first repetition pitch (P1 in FIG. 3) in the first direction.

The second connection region 55*b* faces the first connection region 55*a* in the second direction.

At a first cross section (FIG. 1) perpendicular to the first face F1 and perpendicular to the first direction and including one of the first connection regions 55*a* and one of the second connection regions 55*b*, the drift region 51 is in contact with the first side surface 11*a* of the first trench 11 and the sixth side surface 31*b* of the third trench 31. In the first cross section (FIG. 1), no p'-type connection region is provided between the first trench 11 and the third trench 31.

The length (L1 in FIG. 3) of the second connection region 55*b* in the first direction is, for example, equal to or more than 0.5 μm and equal to or less than 3 μm.

The third connection region 55*c* of pt-type is in contact with the first electric field relaxation region 54*a*. In addition, the third connection region 55*c* is in contact with the second body region 52*b*. The third connection region 55*c* is in contact with the first side surface 11*a* of the first trench 11.

The third connection region 55*c* is repeatedly arranged in the first direction. The third connection region 55*c* is repeatedly arranged at a second repetition pitch (P2 in FIG. 3) in the first direction.

The length (L2 in FIG. 3) of the third connection region 55*c* in the first direction is, for example, equal to or more than 0.5 μm and equal to or less than 3 μm.

The fourth connection region 55*d* of $p^+$-type is in contact with the third electric field relaxation region 54*c*. In addition, the fourth connection region 55*d* is in contact with the second body region 52*b*. The fourth connection region 55*d* is in contact with the sixth side surface 31*b* of the third trench 31.

The fourth connection region 55*d* is repeatedly arranged in the first direction. The fourth connection region 55*d* is arranged at the second repetition pitch (P2 in FIG. 3) in the first direction.

The fourth connection region 55*d* faces the third connection region 55*c* in the second direction.

At a second cross section (FIG. 4) parallel to the first cross section (FIG. 1) and disposed in the first direction of the first cross section (FIG. 1) and including one of the third electric field relaxation regions 54*c* and one of the fourth connection regions 55*d*, the drift region 51 is in contact with the second side surface 11*b* of the first trench 11 and the third side surface 21*a* of the second trench 21. In the second cross section (FIG. 4), no $p^+$-type connection region is provided between the first trench 11 and the second trench 21.

The length (L2 in FIG. 3) of the fourth connection region 55*d* in the first direction is, for example, equal to or more than 0.5 μm and equal to or less than 3 μm.

The first connection region 55*a* and the third connection region 55*c* are alternately arranged in the first direction. The first repetition pitch P1 is, for example, substantially equal to the second repetition pitch P2. The first connection region 55*a* and the third [0101] connection region 55*c* are, for example, alternately arranged at the same repetition pitch in the first direction. The repetition pitch of the first connection region 55*a* and the third connection region 55*c* in the first direction is, for example, a half of the first repetition pitch P1. The repetition pitch of the first connection region 55*a* and the third connection region 55*c* in the first direction is, for example, a half of the second repetition pitch P2.

The half of the first repetition pitch P1 is, for example, equal to or more than 5 μm and equal to or less than 100 μm.

The half of the second repetition pitch P2 is, for example, equal to or more than 5 μm and equal to or less than 100 μm.

The half of the first repetition pitch P1 of the first connection regions 55*a* is, for example, equal to or less than 50 times the length (L1 in FIG. 3) of the first connection region 55*a* in the first direction. The half of the second repetition pitch P2 of the third connection regions 55*c* is, for example, equal to or less than 50 times the length (L2 in FIG. 3) of the third connection region 55*c* in the first direction.

The connection region 55 contains, for example, aluminum (Al) as a p-type impurity. The p-type impurity concentration in the connection region 55 is higher than, for example, the p-type impurity concentration in the body region 52. The p-type impurity concentration in the connection region 55 is, for example, equal to or more than $1\times10^{17}$ $cm^{-3}$ and equal to or less than $1\times10^{20}$ $cm^{-3}$.

The connection region 55 can be formed, for example, by forming a trench in the silicon carbide layer 10 and then ion-implanting aluminum (Al) into the silicon carbide layer 10 from the side surface of the trench by using an oblique ion implantation method.

The connection region 55 has a function of electrically connecting the electric field relaxation region 54 and the body region 52 to each other. The electric field relaxation region 54 is fixed to the electric potential of the source electrode 41 by the connection region 55. The electric field relaxation region 54 is fixed to the source electric potential by the connection region 55.

Next, the function and effect of the semiconductor device according to the first embodiment will be described.

According to the MOSFET 100 of the first embodiment, it is possible to reduce the on-resistance, improve the reliability of the gate insulating layer, and reduce the switching loss at the same time. The details will be described below.

A trench gate structure in which a gate electrode is provided in a trench is applied to the MOSFET 100. By applying the trench gate structure, the channel area per unit area is increased, and accordingly, the on-resistance of the MOSFET 100 is reduced. For example, if the MOSFET 100 is scaled down by reducing the trench width or the repetition pitch of trenches, the on-resistance of the MOSFET 100 is further reduced.

In addition, the MOSFET 100 has the electric field relaxation region 54 at the bottom of the trench. Due to the electric field relaxation region 54, the electric field applied to the gate insulating layer at the bottom of the trench is relaxed when the MOSFET 100 is turned off. Therefore, the reliability of the gate insulating layer is improved.

For example, when the electric potential of the electric field relaxation region 54 is in a floating state, the switching loss of the MOSFET increases. For example, when the electric potential of the electric field relaxation region 54 is in a floating state, the switching loss increases because it takes time to discharge holes from the electric field relaxation region 54 when the MOSFET is turned off.

The MOSFET 100 has the connection region 55 for electrically connecting the electric field relaxation region 54 and the body region 52 to each other. Since the MOSFET 100 has the connection region 55, the electric potential of the electric field relaxation region 54 is fixed to the electric potential of the source electrode 41. Therefore, for example, when the MOSFET is turned off, the discharge of holes from the electric field relaxation region 54 is promoted. As a result, the switching loss of the MOSFET 100 can be reduced.

Figure 6:
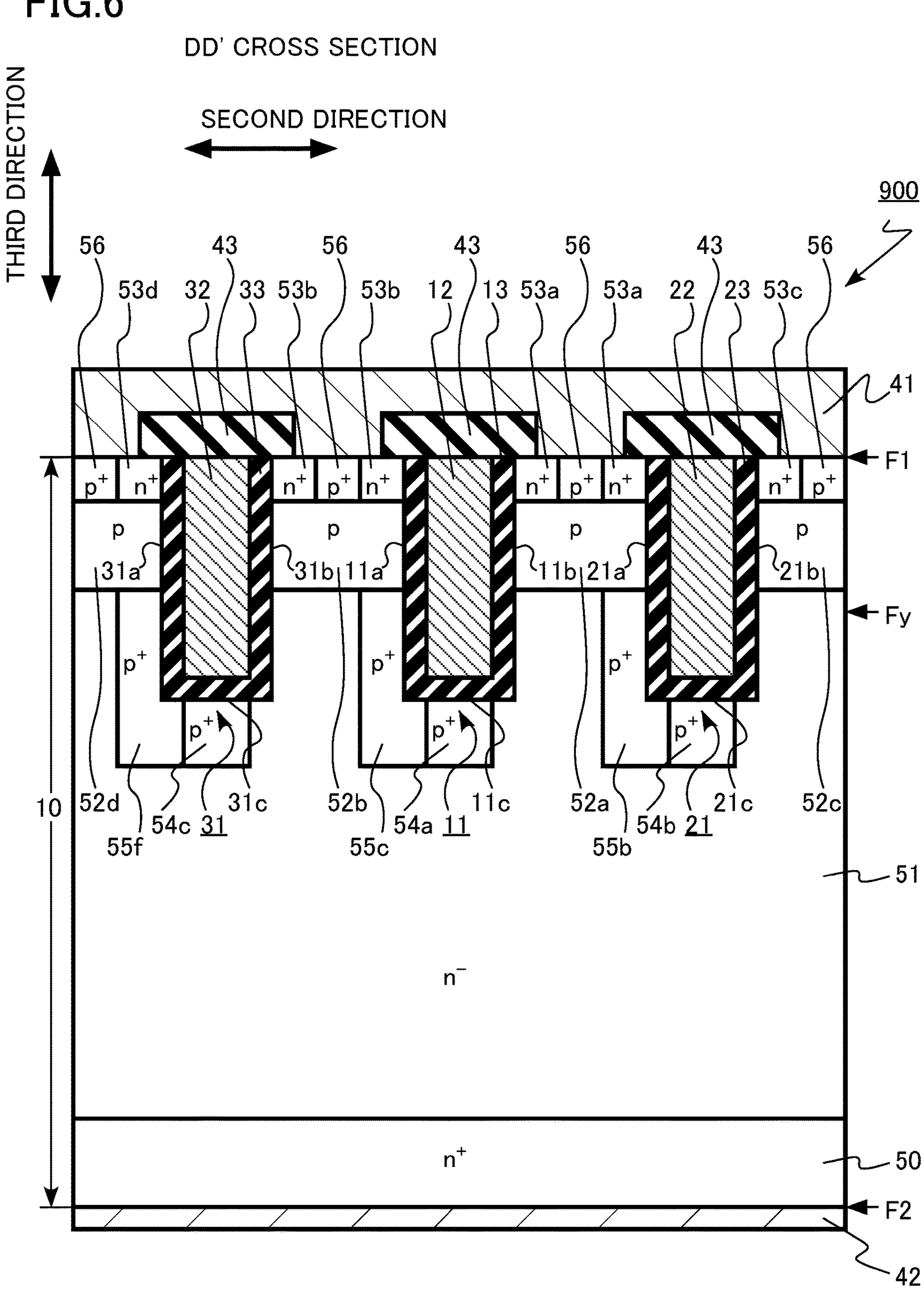
FIG. 6 is a schematic cross-sectional view of a semiconductor device of a comparative example.

FIG. 6 is a schematic cross-sectional view of a semiconductor device of a comparative example. The semiconductor device of the comparative example is a trench gate type vertical MOSFET 900 using silicon carbide. The MOSFET 900 is an n-channel MOSFET having electrons as carriers.

Figure 7:
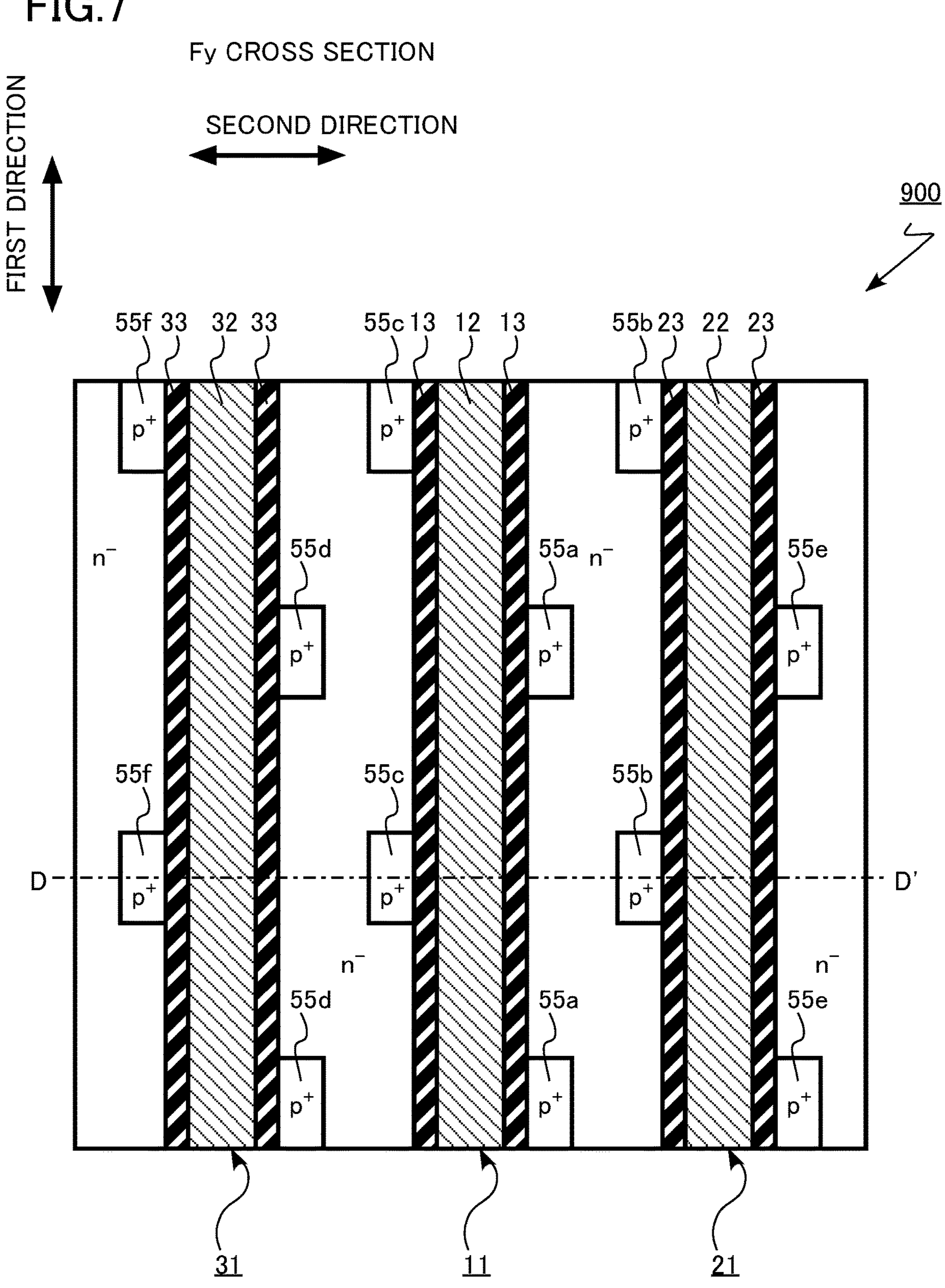
FIG. 7 is a schematic cross-sectional view of a semiconductor device of a comparative example.

FIG. 7 is a schematic cross-sectional view of a semiconductor device of a comparative example. FIG. 7 shows a cross section taken along Fy of FIG. 6. FIG. 7 shows a cross section parallel to the first direction and the second direction. FIG. 7 shows a cross section parallel to the first face F1. FIG. 6 is a cross-sectional view taken along the line DD' of FIG. 7.

The MOSFET 900 of the comparative example is different from the MOSFET 100 according to the first embodiment in that the first connection region 55*a* and the second connection region 55*b* are alternately arranged in the first direction between the first trench 11 and the second trench 21. The first connection region 55*a* and the second connection region 55*b* do not face each other in the second direction.

In addition, the MOSFET 900 of the comparative example is different from the MOSFET 100 according to the first embodiment in that the third connection region 55*c* and the fourth connection region 55*d* are alternately arranged in the first direction between the first trench 11 and the third trench 31. The third connection region 55*c* and the fourth connection region 55*d* do not face each other in the second direction.

In the MOSFET 100 according to the first embodiment, in the AA' cross section, two connection regions 55 are arranged between the first trench 11 and the second trench 21, and no connection region 55 is arranged between the first trench 11 and the third trench 31. On the other hand, in the MOSFET 900 of the comparative example, in the DD' cross section, one connection region 55 is arranged between the first trench 11 and the second trench 21, and one connection region 55 is arranged between the first trench 11 and the third trench 31.

As is apparent from the comparison between FIGS. 3 and 7, the occupied area of the connection region 55 is the same in the case of the MOSFET 100 and the case of the MOSFET 900. Therefore, the electrical resistance from the source electrode 41 to the electric field relaxation region 54 is the same in the case of the MOSFET 100 and the case of the MOSFET 900.

Figure 8:
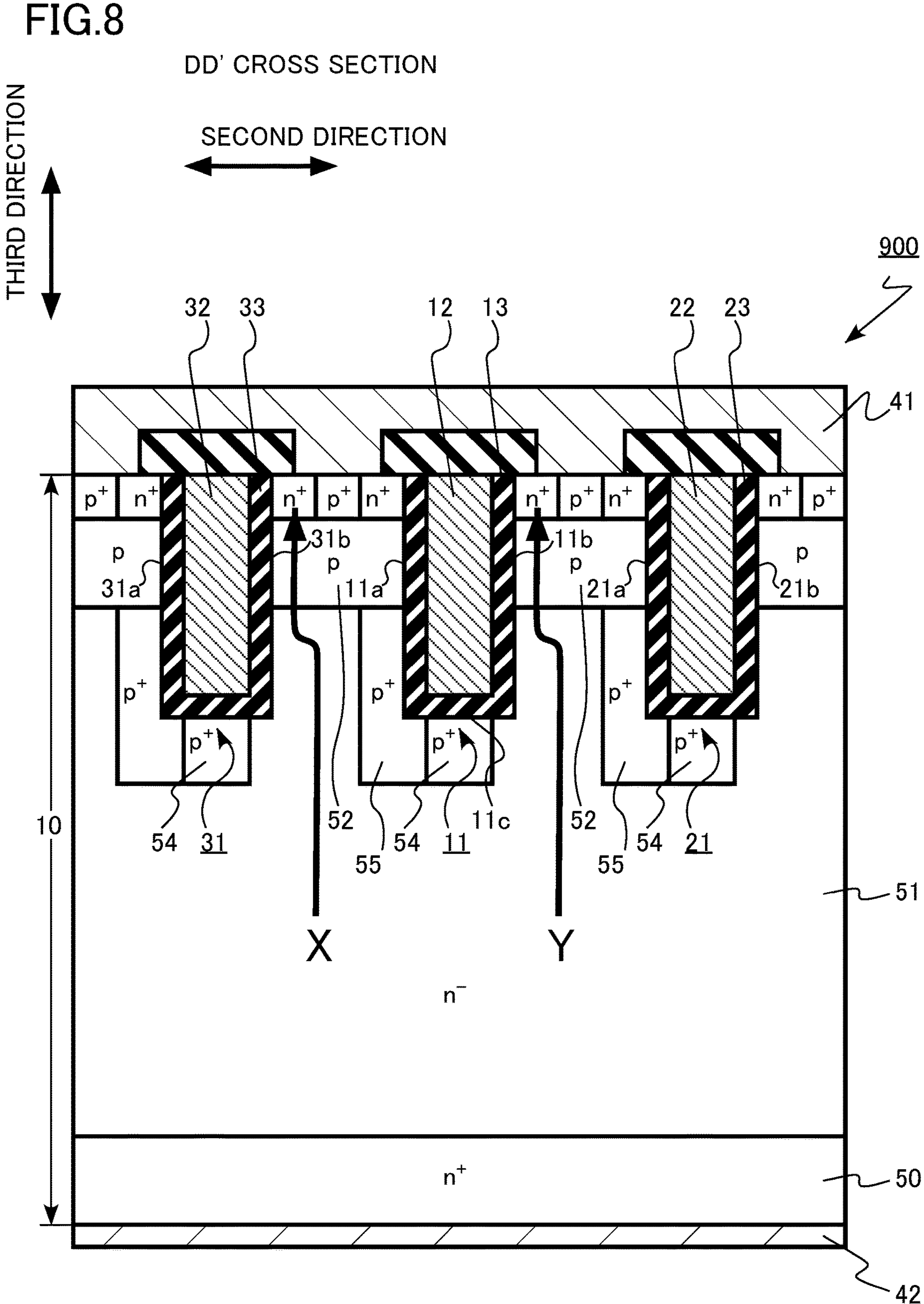
FIG. 8 is an explanatory diagram of a problem of the semiconductor device of the comparative example.

FIG. 8 is an explanatory diagram of a problem of the semiconductor device of the comparative example. FIG. 8 is a cross-sectional view corresponding to FIG. 6. FIG. 8 shows a current path when the MOSFET 900 of the comparative example is turned on.

In the MOSFET 900 of the comparative example, there are two current paths between the second trench 21 and the third trench 31. The two current paths are a first current path X and a second current path Y.

The first current path X is present between the first trench 11 and the third trench 31. In the first current path X, a current flows through a channel formed in a region where the sixth side surface 31*b* of the third trench 31 and the body region 52 are in contact with each other.

The second current path Y is present between the first trench 11 and the second trench 21. In the second current path Y, a current flows through a channel formed in a region where the second side surface 11*b* of the first trench 11 and the body region 52 are in contact with each other.

On the other hand, in a region along the first side surface 11*a* of the first trench 11, no current flows because the connection region 55 is present below the body region 52.

Similarly, in a region along the third side surface 21*a* of the second trench 21, no current flows because the connection region 55 is present below the body region 52.

In the first current path X, the current path is narrowed between the third trench 31 and the connection region 55. In addition, in the first current path X, the current path is narrowed between the electric field relaxation region 54 and the connection region 55.

In the second current path Y, the current path is narrowed between the first trench 11 and the connection region 55. In addition, in the second current path Y, the current path is narrowed between the electric field relaxation region 54 and the connection region 55.

Since the first current path X and the second current path Y are narrowed, the on-resistance of the MOSFET 900 increases. In particular, as the MOSFET 900 becomes scaled down, the narrowing of the current path becomes stronger if the distance between the trenches in the second direction becomes shorter. Therefore, the increase in the on-resistance of the MOSFET 900 according to the scaling-down becomes noticeable.

Figure 9:
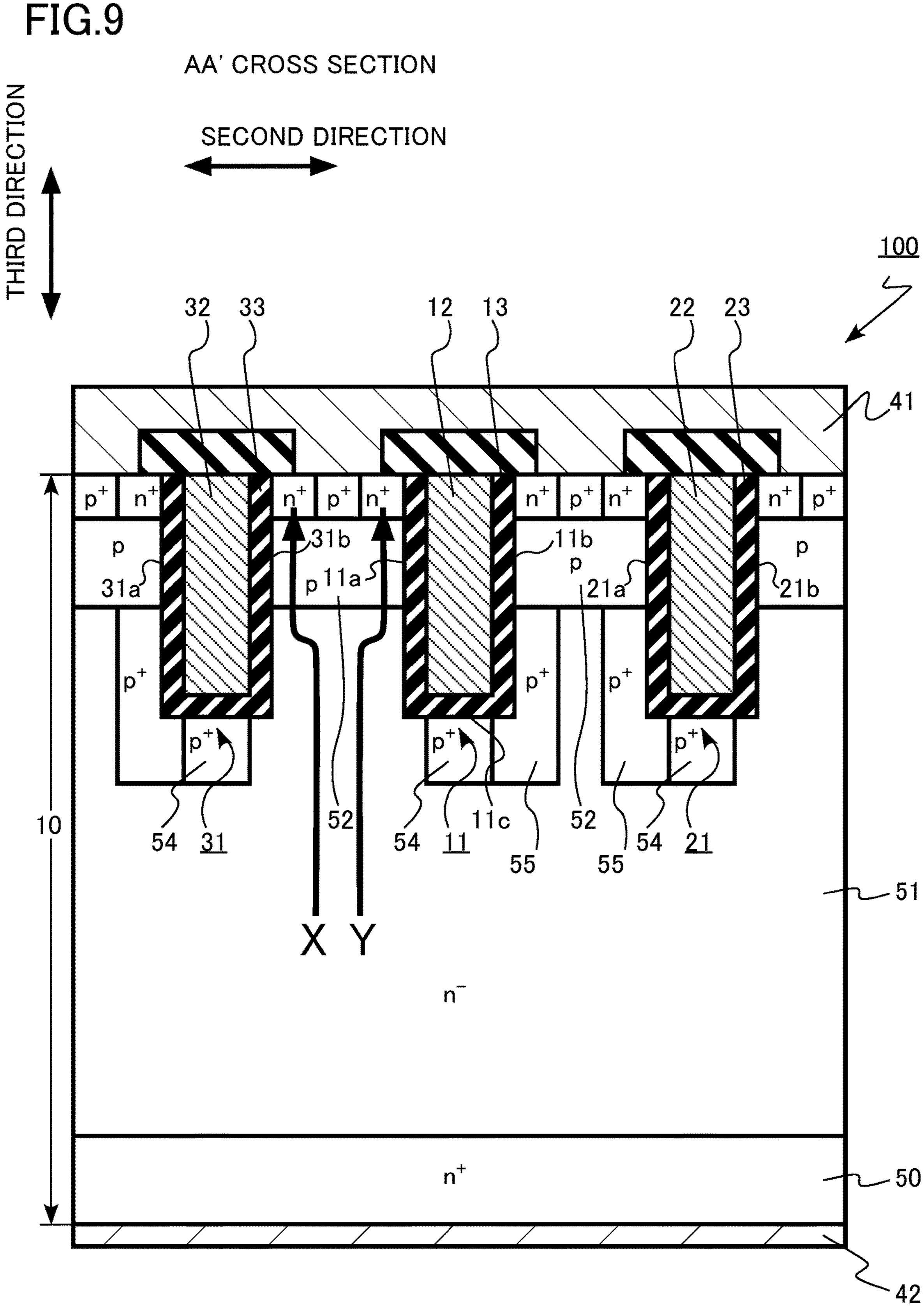
FIG. 9 is an explanatory diagram of the function and effect of the semiconductor device according to the first embodiment.

FIG. 9 is an explanatory diagram of the function and effect of the semiconductor device according to the first embodiment. FIG. 9 is a cross-sectional view corresponding to FIG. 1. FIG. 9 shows a current path when the MOSFET 100 according to the first embodiment is turned on.

In the MOSFET 100 according to the first embodiment, there are two current paths between the second trench 21 and the third trench 31. The two current paths are a first current path X and a second current path Y.

The first current path X is present between the first trench 11 and the third trench 31. In the first current path X, a current flows through a channel formed in a region where the sixth side surface 31*b* of the third trench 31 and the body region 52 are in contact with each other.

The second current path Y is present between the first trench 11 and the third trench 31. In the second current path Y, a current flows through a channel formed in a region where the first side surface 11*a* of the first trench 11 and the body region 52 are in contact with each other.

On the other hand, in a region along the second side surface 11*b* of the first trench 11, no current flows because the connection region 55 is present below the body region 52. Similarly, in a region along the third side surface 21*a* of the second trench 21, no current flows because the connection region 55 is present below the body region 52.

There is no connection region 55 between the first trench 11 and the third trench 31. Therefore, in the first current path X and the second current path Y, the current path is not narrowed between the trench and the connection region 55 or between the electric field relaxation region 54 and the connection region 55.

Since the first current path X and the second current path Y are not narrowed in the connection region 55, the increase in the on-resistance of the MOSFET 100 is suppressed. In particular, even when the MOSFET 100 is scaled down and the distance between the trenches in the second direction is shortened, the increase in on-resistance is suppressed.

In the MOSFET 100, as shown in FIG. 3, the first connection region 55*a* and the third connection region 55*c* are alternately arranged in the first direction. For this reason, the current paths are alternately formed in the first direction. Therefore, in the MOSFET 100, the heat generation points are dispersed without being biased. As a result, the failure of the MOSFET 100 due to heat generation is suppressed to improve the reliability of the MOSFET 100.

From the viewpoint of scaling down the MOSFET 100 and reducing the on-resistance, the distance (d in FIG. 2) between the first trench 11 and the second trench 21 and the distance (d in FIG. 2) between the first trench 11 and the third trench 31 are preferably equal to or less than 2 μm, more preferably equal to or less than 1.5 μm, and even more preferably equal to or less than 1 μm.

From the viewpoint of scaling down the MOSFET 100 and reducing the on-resistance, the widths (w in FIG. 2) of the first trench 11, the second trench 21, and the third trench 31 in the second direction are preferably equal to or less than 1 μm, more preferably equal to or less than 0.7 μm.

From the viewpoint of reducing the electrical resistance between the source electrode 41 and the electric field relaxation region 54, the lengths (L1 in FIG. 3) of the first connection region 55*a* and the second connection region 55*b* in the first direction are preferably equal to or more than 0.5 μm, more preferably equal to or more than 1 μm, and even more preferably equal to or more than 2 μm.

From the viewpoint of reducing the on-resistance of the MOSFET 100, the length (L1 in FIG. 3) of the first connection region 55*a* in the first direction is preferably equal to or less than 3 μm, more preferably equal to or less than 2 μm, and even more preferably equal to or less than 1 μm.

From the viewpoint of reducing the electrical resistance between the source electrode 41 and the electric field relaxation region 54, the lengths (L2 in FIG. 3) of the third connection region 55*c* and the fourth connection region 55*d* in the first direction are preferably equal to or more than 0.5 μm, more preferably equal to or more than 1 μm, and even more preferably equal to or more than 2 μm.

From the viewpoint of reducing the on-resistance of the MOSFET 100, the lengths (L2 in FIG. 3) of the third connection region 55*c* and the fourth connection region 55*d* in the first direction are preferably equal to or less than 3 μm, more preferably equal to or less than 2 μm, and even more preferably equal to or less than 1 μm.

From the viewpoint of reducing the electrical resistance between the source electrode 41 and the electric field relaxation region 54, the half of the first repetition pitch P1 of the first connection regions 55*a* in the first direction and the half of the first repetition pitch P1 of the second connection regions 55*b* in the first direction are preferably equal to or less than 100 μm, more preferably equal to or less than 50 μm, and even more preferably equal to or less than 10 μm.

From the viewpoint of reducing the on-resistance of the MOSFET 100, the half of the first repetition pitch P1 of the first connection regions 55*a* in the first direction and the half of the first repetition pitch P1 of the second connection regions 55*b* in the first direction are preferably equal to or more than 5 μm, more preferably equal to or more than 10 μm, and even more preferably equal to or more than 50 μm.

From the viewpoint of reducing the electrical resistance between the source electrode 41 and the electric field relaxation region 54, the half of the second repetition pitch P2 of the third connection regions 55*c* in the first direction and the half of the second repetition pitch P2 of the fourth connection regions 55*d* in the first direction are preferably equal to or less than 100 μm, more preferably equal to or less than 50 μm, and even more preferably equal to or less than 10 μm.

From the viewpoint of reducing the on-resistance of the MOSFET 100, the half of the second repetition pitch P2 of the third connection regions 55*c* in the first direction and the half of the second repetition pitch P2 of the fourth connection regions 55*d* in the first direction are preferably equal to or more than 5 μm, more preferably equal to or more than 10 μm, and even more preferably equal to or more than 50 μm.

From the viewpoint of reducing the electrical resistance between the source electrode 41 and the electric field relaxation region 54, the half of the first repetition pitch P1 of the first connection regions 55*a* is preferably equal to or less than 50 times the length (L1 in FIG. 3) of the first connection region 55*a* in the first direction, more preferably equal to or less than 10 times, and even more preferably equal to or less than 5 times. The half of the second repetition pitch P2 of the third connection regions 55*c* is preferably equal to or less than 50 times the length (L2 in FIG. 3) of the third connection region 55*c* in the first direction, more preferably equal to or less than 10 times, and even more preferably equal to or less than 5 times.

First Modification Example

Figure 10:
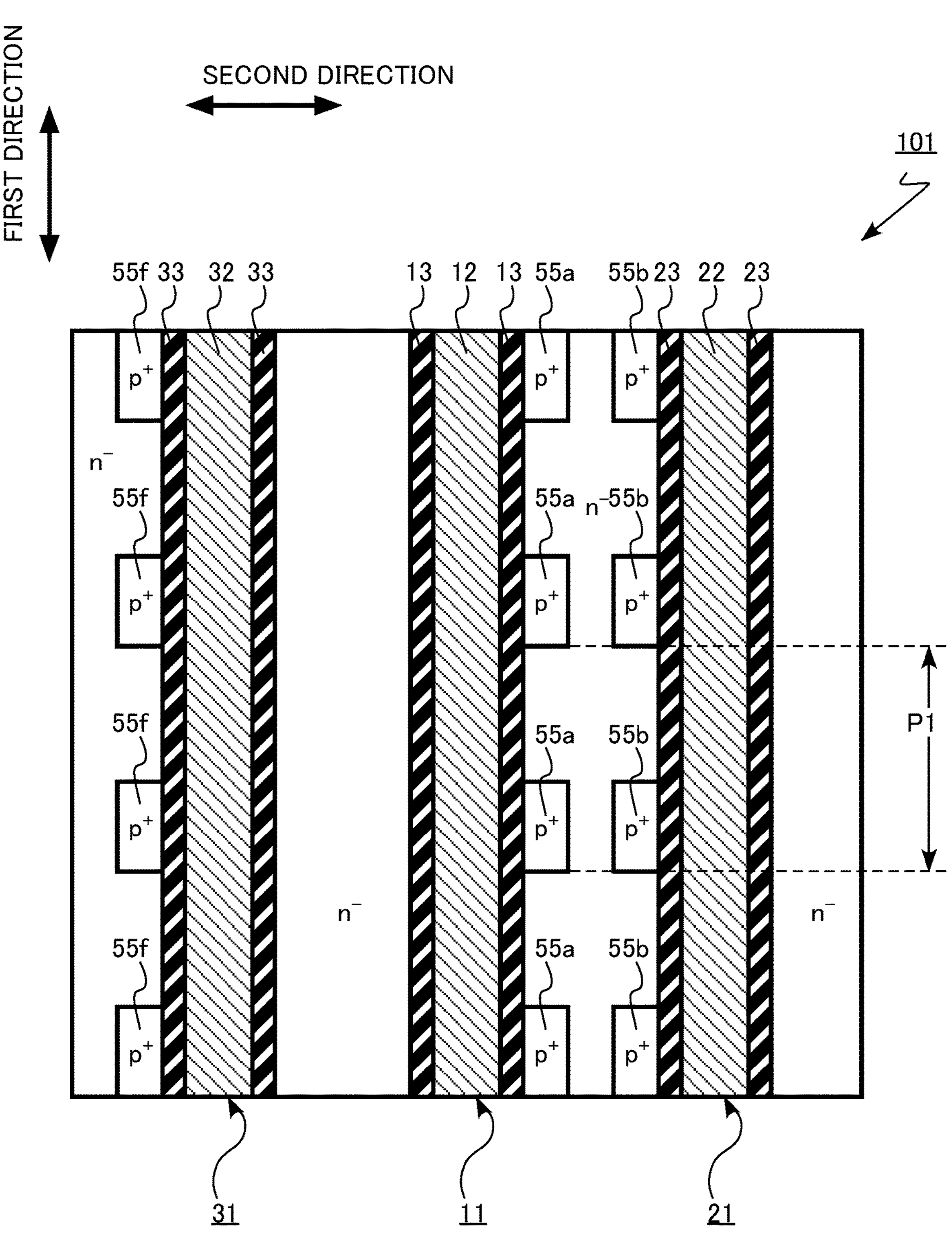
FIG. 10 is a schematic cross-sectional view of a semiconductor device of a first modification example of the first embodiment.

FIG. 10 is a schematic cross-sectional view of a semiconductor device of a first modification example of the first embodiment. FIG. 10 is a diagram corresponding to FIG. 3 of the first embodiment.

A MOSFET 101 of the first modification example is different from the MOSFET 100 according to the first embodiment in that the third connection region 55*c* and the fourth connection region 55*d* are not provided between the first trench 11 and the third trench 31. In the MOSFET 101 of the first modification example, the connection region 55 is not provided between the first trench 11 and the third trench 31.

The first repetition pitch P1 of the first connection regions 55*a* in the first direction and the first repetition pitch P1 of the second connection regions 55*b* in the first direction are preferably equal to or more than 5 μm, more preferably equal to or more than 10 μm, and even more preferably equal to or more than 50 μm.

The half of the first repetition pitch P1 of the first connection regions 55*a* is preferably equal to or less than 50 times the length of the first connection region 55*a* in the first direction, more preferably equal to or less than 10 times, and even more preferably equal to or less than 5 times.

Second Modification Example

Figure 11:
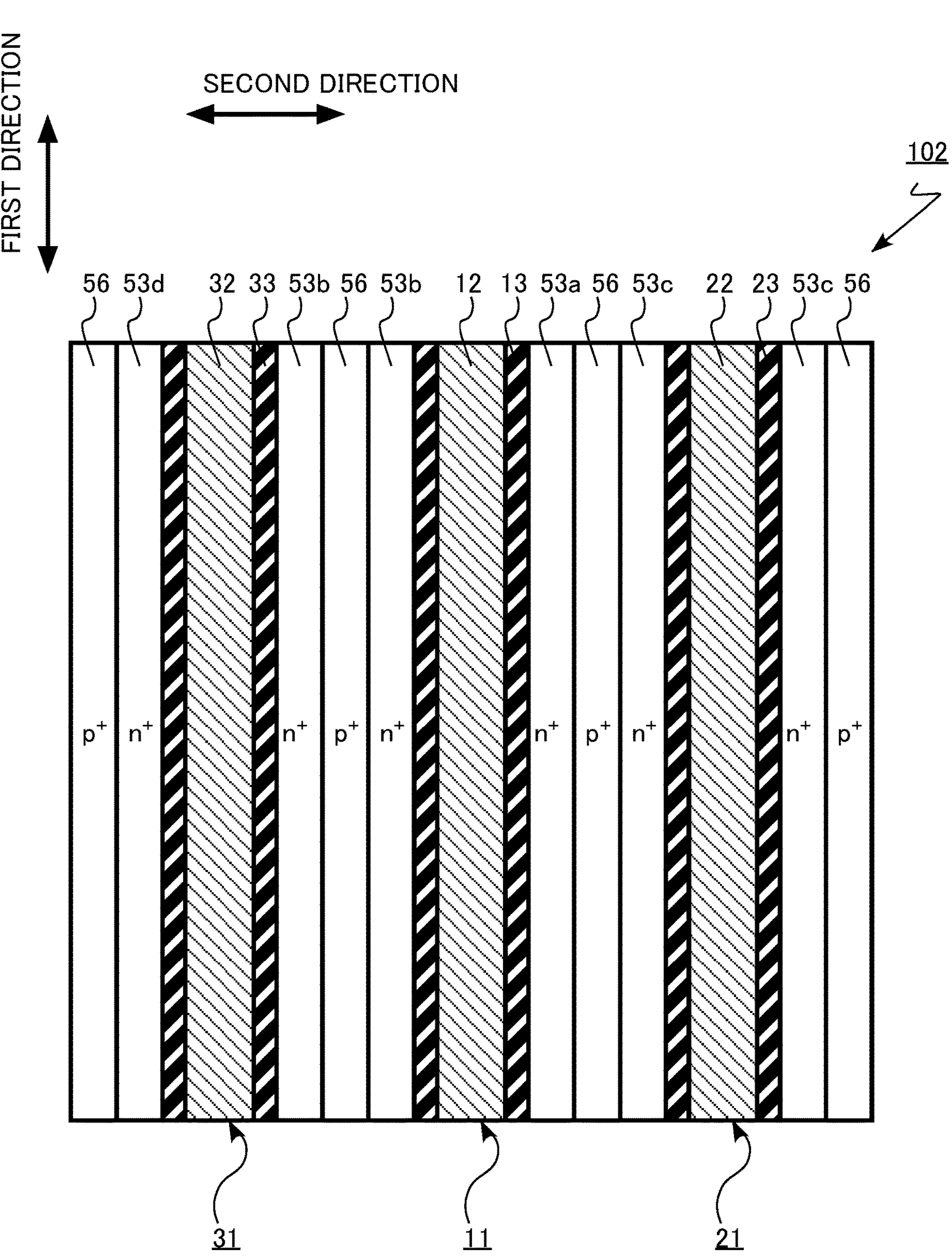
FIG. 11 is a schematic cross-sectional view of a semiconductor device of a second modification example of the first embodiment.

FIG. 11 is a schematic cross-sectional view of a semiconductor device of a second modification example of the first embodiment. FIG. 11 is a diagram corresponding to FIG. 2 of the first embodiment.

A MOSFET 102 of the second modification example is different from the MOSFET 100 according to the first embodiment in that the $p^+$-type contact region 56 has a striped shape extending in the first direction.

According to the MOSFET 102 of the second modification example, it is possible to further reduce the electric resistance between the source electrode 41 and the electric field relaxation region 54.

As described above, according to the MOSFETs of the first embodiment and the modification examples, it is possible to reduce the on-resistance, improve the reliability of the gate insulating layer, and reduce the switching loss at the same time.

Second Embodiment

A semiconductor device according to a second embodiment is different from the semiconductor device according to the first embodiment in that the ninth silicon carbide region and the tenth silicon carbide region are in contact with each other at the first cross section. Hereinafter, the description of a part of the content overlapping the first embodiment will be omitted.

Figure 12:
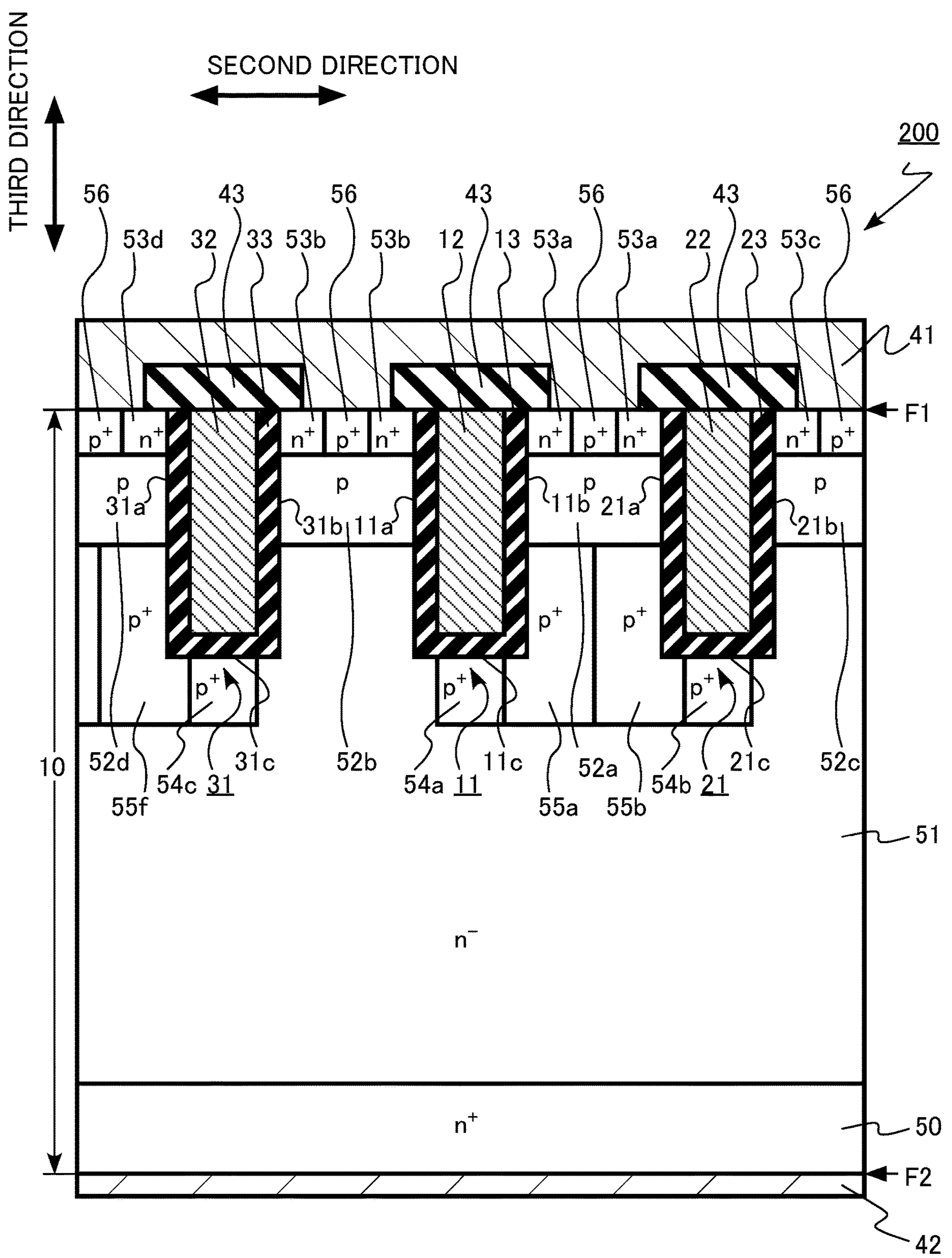
FIG. 12 is a schematic cross-sectional view of a semiconductor device according to a second embodiment.

FIG. 12 is a schematic cross-sectional view of the semiconductor device according to the second embodiment. The semiconductor device according to the second embodiment is a trench gate type vertical MOSFET 200 using silicon carbide. The MOSFET 200 is an n-channel MOSFET having electrons as carriers. FIG. 12 is a diagram corresponding to FIG. 1 of the first embodiment.

In the MOSFET 200 according to the second embodiment, the first connection region 55*a* (ninth silicon carbide region) and the second connection region 55*b* (tenth silicon carbide region) are in contact with each other in the second direction. In the MOSFET 200 according to the second embodiment, the third connection region 55*c* (eleventh silicon carbide region) and the fourth connection region 55*d* (twelfth silicon carbide region) are in contact with each other in the second direction.

According to the MOSFET 200 of the second embodiment, the electric resistance between the source electrode 41 and the electric field relaxation region 54 is further reduced as compared with the MOSFET 100 according to the first embodiment. Therefore, the switching loss of the MOSFET 200 is further reduced.

As described above, according to the MOSFET of the second embodiment, it is possible to realize the reduction of the on-resistance, the improvement of the reliability of the gate insulating layer, and the reduction of the switching loss at the same time.

Third Embodiment

A semiconductor device according to a third embodiment is different from the semiconductor device according to the first embodiment in that the sixth silicon carbide region is in contact with the first side surface at the first cross section and the seventh silicon carbide region is in contact with the fourth side surface at the first cross section. Hereinafter, the description of a part of the content overlapping the first embodiment will be omitted.

Figure 13:
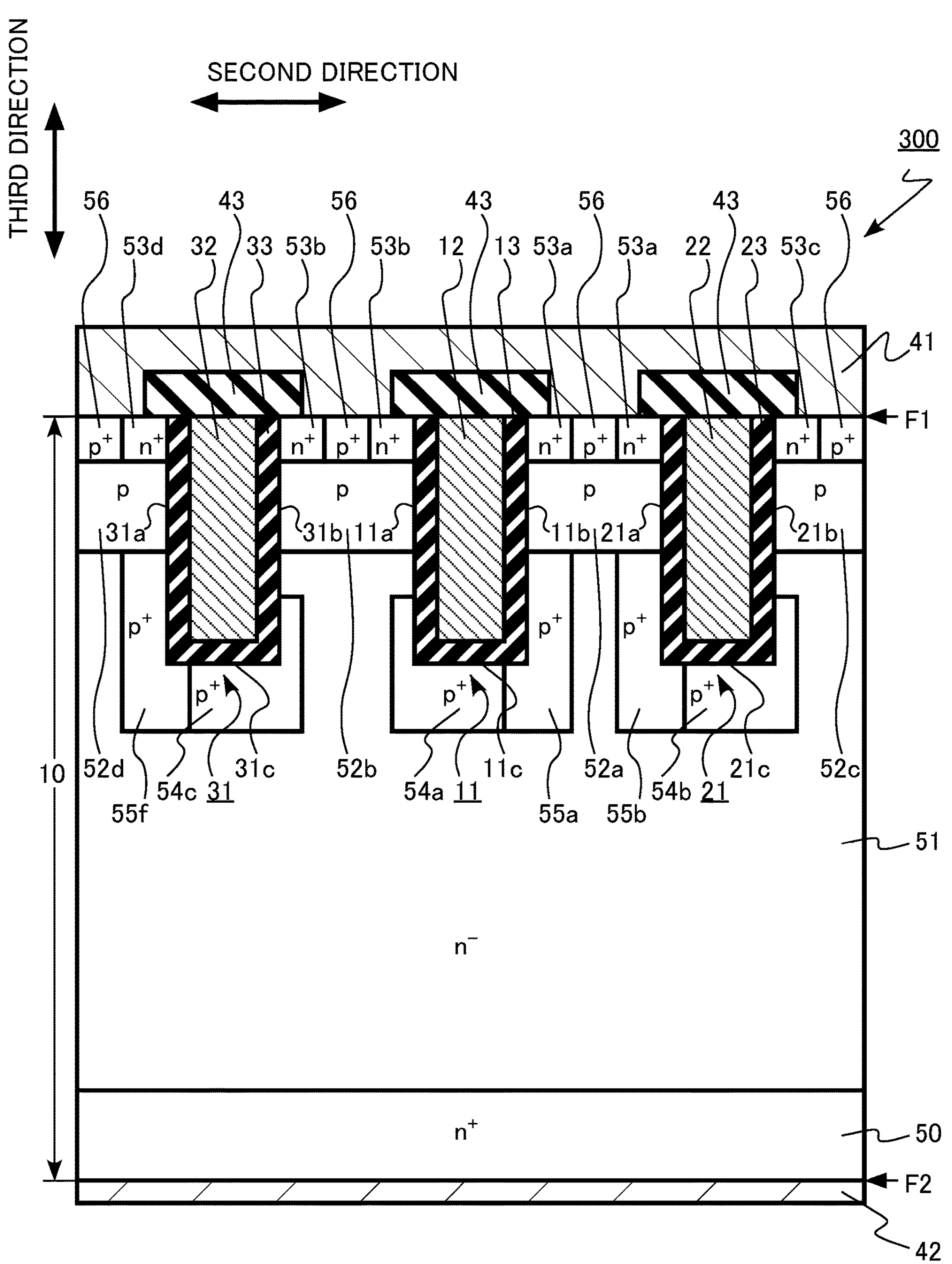
FIG. 13 is a schematic cross-sectional view of a semiconductor device according to a third embodiment.

FIG. 13 is a schematic cross-sectional view of the semiconductor device according to the third embodiment. The semiconductor device according to the third embodiment is a trench gate type vertical MOSFET 300 using silicon carbide. The MOSFET 300 is an n-channel MOSFET having electrons as carriers. FIG. 13 is a diagram corresponding to FIG. 1 of the first embodiment.

In the MOSFET 300 according to the third embodiment, the first electric field relaxation region 54*a* (sixth silicon carbide region) is in contact with the first side surface 11*a* of the first trench 11. In addition, the second electric field relaxation region 54*b* (seventh silicon carbide region) is in contact with the fourth side surface 21*b* of the second trench 21.

The end of the first electric field relaxation region 54*a* on the third trench 31 side is disposed closer to the third trench 31 than the first side surface 11*a* of the first trench 11.

In the MOSFET 300 according to the third embodiment, the bottom of the trench is covered with the electric field relaxation region 54 and the connection region 55. Therefore, the reliability of the gate insulating layer is further improved as compared with the MOSFET 100 according to the first embodiment.

As described above, according to the MOSFET of the third embodiment, it is possible to reduce the on-resistance, improve the reliability of the gate insulating layer, and reduce the switching loss at the same time.

Fourth Embodiment

A semiconductor device according to a fourth embodiment is different from the semiconductor device according to the first embodiment in that the first silicon carbide region includes a first region and a second region that is provided between the first region and the second silicon carbide region and has a higher n-type impurity concentration than the first region. Hereinafter, the description of a part of the content overlapping the first embodiment will be omitted.

Figure 14:
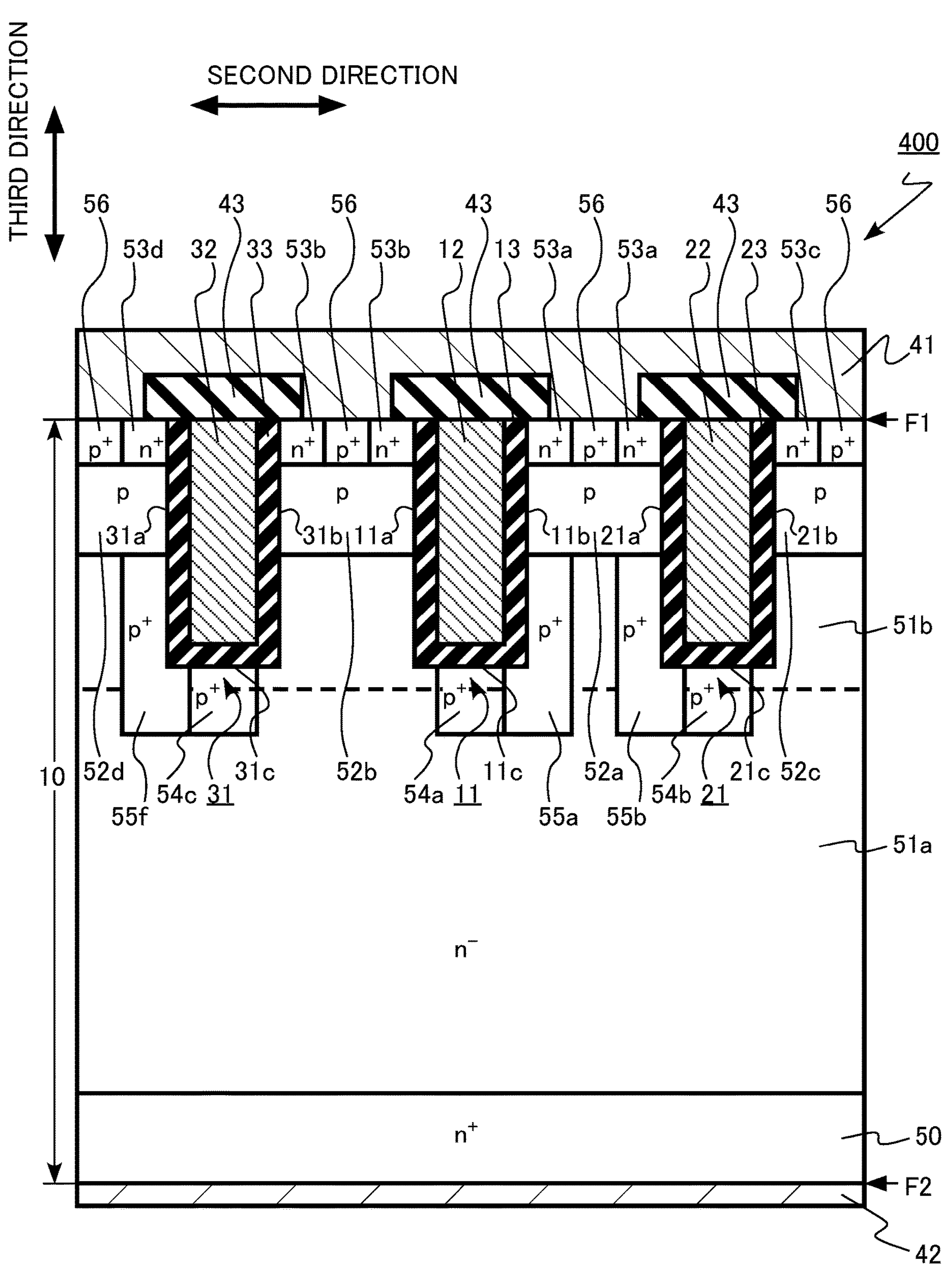
FIG. 14 is a schematic cross-sectional view of a semiconductor device according to a fourth embodiment.

FIG. 14 is a schematic cross-sectional view of the semiconductor device according to the fourth embodiment. The semiconductor device according to the fourth embodiment is a trench gate type vertical MOSFET 400 using silicon carbide. The MOSFET 400 is an n-channel MOSFET having electrons as carriers. FIG. 14 is a diagram corresponding to FIG. 1 of the first embodiment.

In the MOSFET 400 according to the fourth embodiment, the $n^-$-type drift region 51 includes a first region 51*a* and a second region 51*b*. The second region 51*b* is provided between the first region 51*a* and the body region 52. The second region 51*b* is provided, for example, between the first region 51*a* and the first body region 52*a*.

The n-type impurity concentration in the second region 51*b* is higher than the n-type impurity concentration in the first region 51*a*. The n-type impurity concentration in the second region 51*b* is, for example, equal to or more than twice the n-type impurity concentration in the first region 51*a*.

According to the MOSFET 400 of the fourth embodiment, the electric resistance of the drift region 51 is reduced as compared with the MOSFET 100 according to the first embodiment. Therefore, the on-resistance of the MOSFET 400 is reduced.

As described above, according to the MOSFET of the fourth embodiment, it is possible to reduce the on-resistance, improve the reliability of the gate insulating layer, and reduce the switching loss at the same time.

Fifth Embodiment

A semiconductor device according to a fifth embodiment is different from the semiconductor device according to the first embodiment in that the upper surface of the interlayer insulating layer 43 is provided in the trench. Hereinafter, the description of a part of the content overlapping the first embodiment will be omitted.

Figure 15:
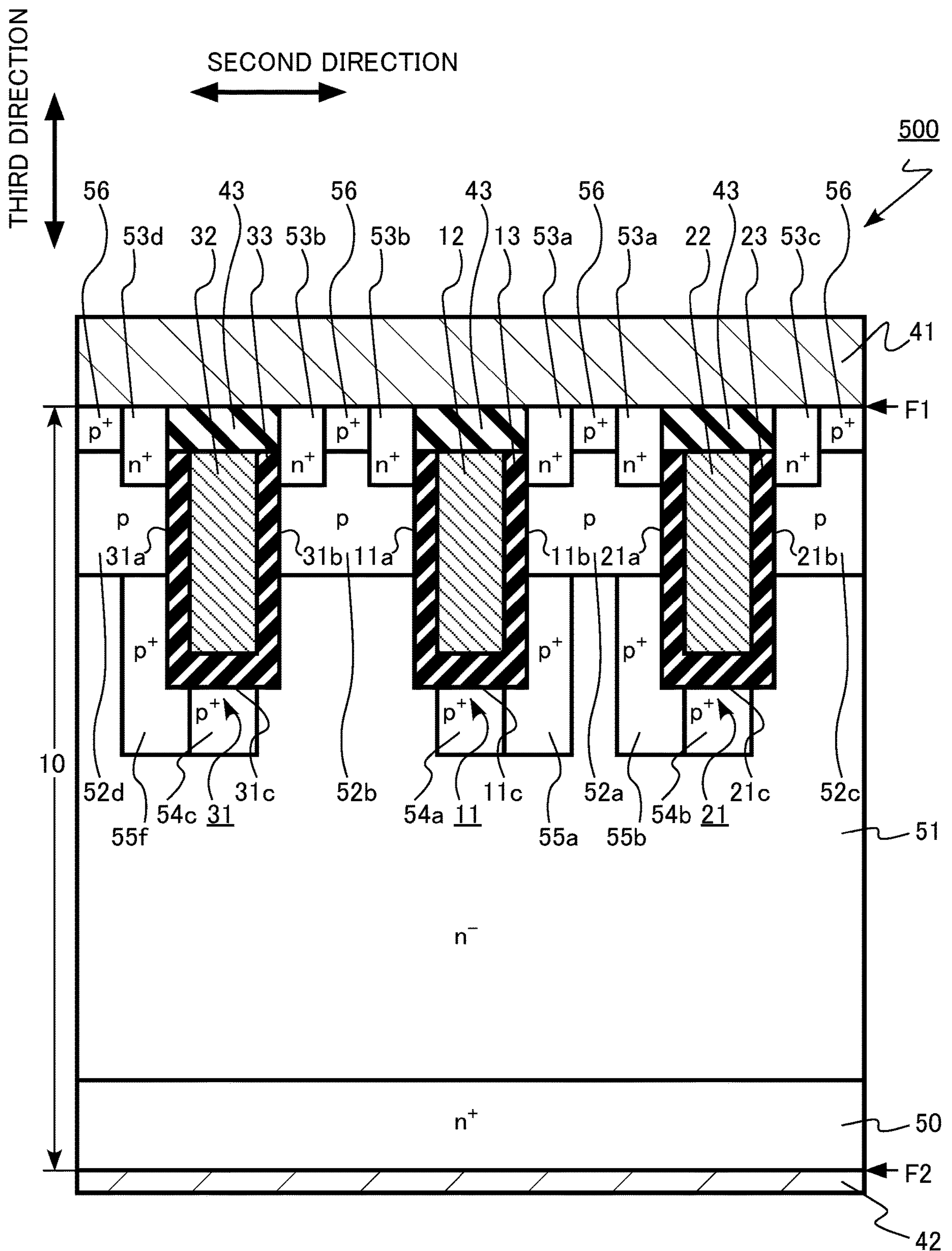
FIG. 15 is a schematic cross-sectional view of a semiconductor device according to a fifth embodiment.

FIG. 15 is a schematic cross-sectional view of the semiconductor device according to the fifth embodiment. The semiconductor device according to the fifth embodiment is a trench gate type vertical MOSFET 500 using silicon carbide. The MOSFET 500 is an n-channel MOSFET having electrons as carriers. FIG. 15 is a diagram corresponding to FIG. 1 of the first embodiment.

In the MOSFET 500 according to the fifth embodiment, the upper surface of the interlayer insulating layer 43 is provided in the trench. In the MOSFET 500 according to the fifth embodiment, patterning of the interlayer insulating layer 43 on the surface of the silicon carbide layer 10 is not necessary. Therefore, it becomes easy to scale down the MOSFET 500 according to the fifth embodiment as compared with the MOSFET 100 according to the first embodiment. As a result, in the MOSFET 500 according to the fifth embodiment, it becomes easy to further reduce the on-resistance.

As described above, according to the MOSFET of the fifth embodiment, it is possible to reduce the on-resistance, improve the reliability of the gate insulating layer, and reduce the switching loss at the same time.

Sixth Embodiment

An inverter circuit and a drive device according to a sixth embodiment are an inverter circuit and a drive device each including the semiconductor device according to the first embodiment.

Figure 16:
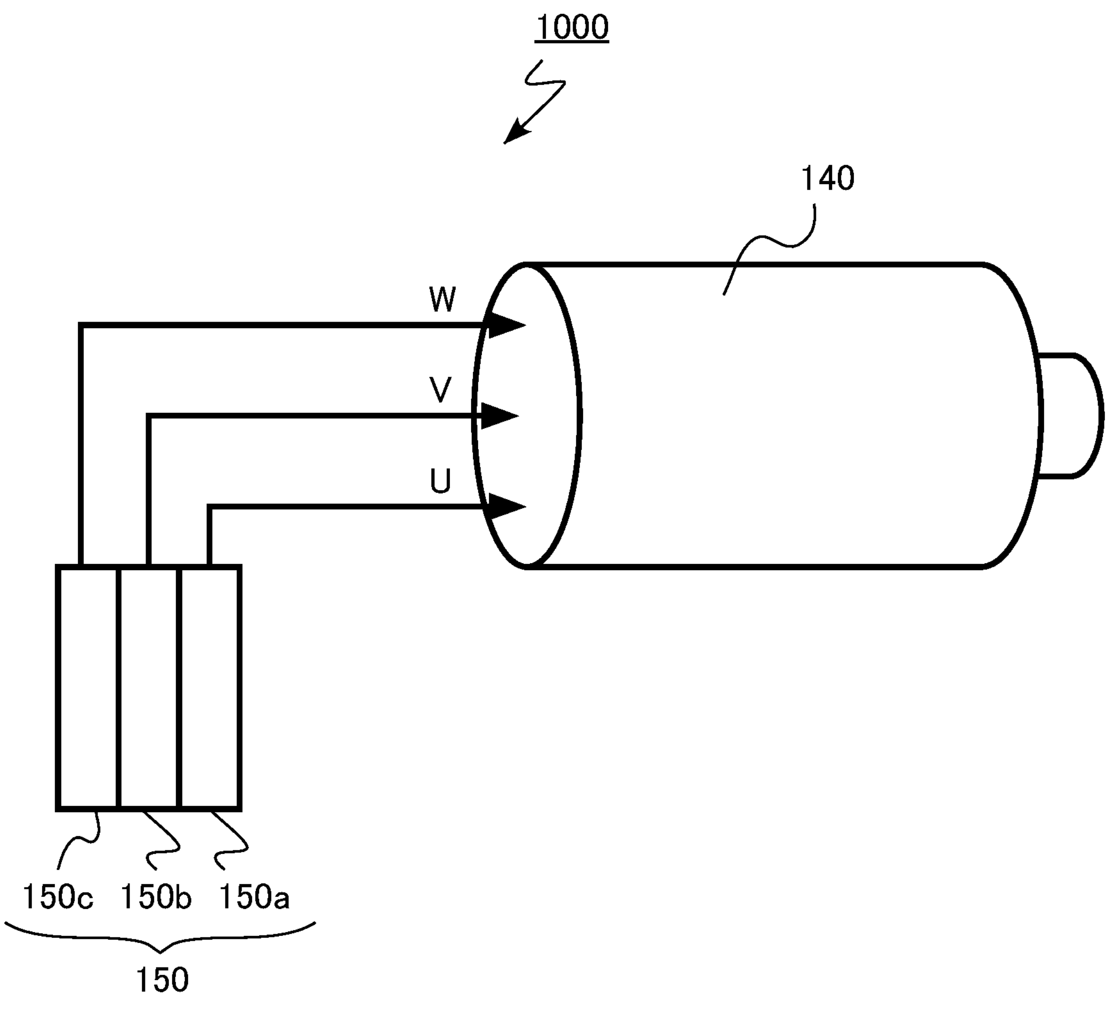
FIG. 16 is a schematic diagram of a drive device according to a sixth embodiment.

FIG. 16 is a schematic diagram of the drive device according to the sixth embodiment. A drive device 1000 includes a motor 140 and an inverter circuit 150.

The inverter circuit 150 includes three semiconductor modules 150*a*, 150*b*, and 150*c* having the MOSFET 100 according to the first embodiment as a switching element. By connecting the three semiconductor modules 150*a*, 150*b*, and 150*c* in parallel to each other, a three-phase inverter circuit 150 having three AC voltage output terminals U, V, and W is realized. The motor 140 is driven by the AC voltage output from the inverter circuit 150.

According to the sixth embodiment, the characteristics of the inverter circuit 150 and the drive device 1000 are improved by providing the MOSFET 100 with improved characteristics.

Seventh Embodiment

A vehicle according to a seventh embodiment is a vehicle including the semiconductor device according to the first embodiment.

Figure 17:
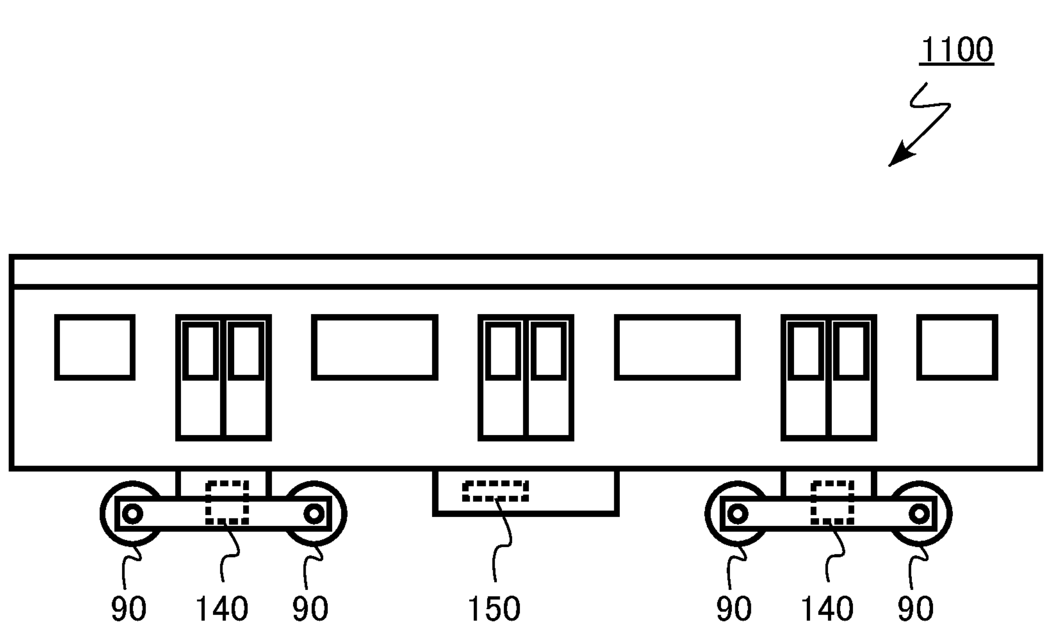
FIG. 17 is a schematic diagram of a vehicle according to a seventh embodiment.

FIG. 17 is a schematic diagram of the vehicle according to the seventh embodiment. A vehicle 1100 according to the seventh embodiment is a railroad vehicle. The vehicle 1100 includes a motor 140 and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 1100.

According to the seventh embodiment, the characteristics of the vehicle 1100 are improved by providing the MOSFET 100 with improved characteristics.

Eighth Embodiment

A vehicle according to an eighth embodiment is a vehicle including the semiconductor device according to the first embodiment.

Figure 18:
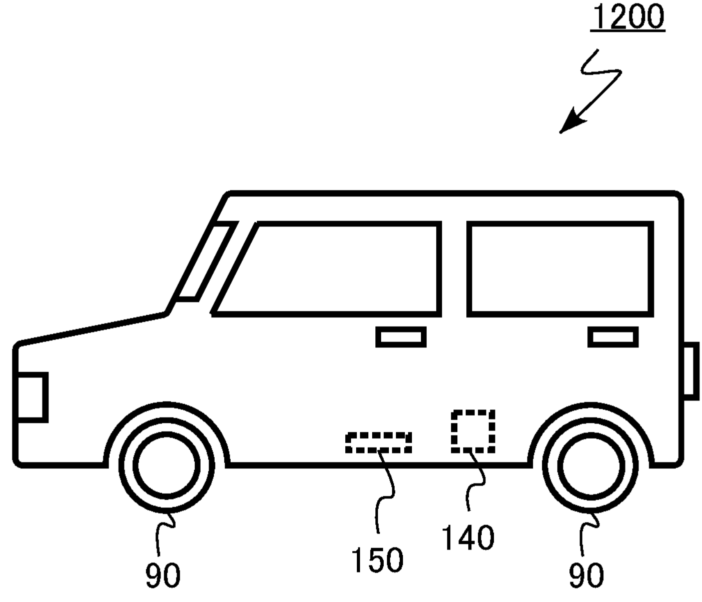
FIG. 18 is a schematic diagram of a vehicle according to an eighth embodiment.

FIG. 18 is a schematic diagram of the vehicle according to the eighth embodiment. A vehicle 1200 according to the eighth embodiment is an automobile. The vehicle 1200 includes a motor 140 and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 1200.

According to the eighth embodiment, the characteristics of the vehicle 1200 are improved by providing the MOSFET 100 with improved characteristics.

Ninth Embodiment

An elevator according to a ninth embodiment is an elevator including the semiconductor device according to the first embodiment.

Figure 19:
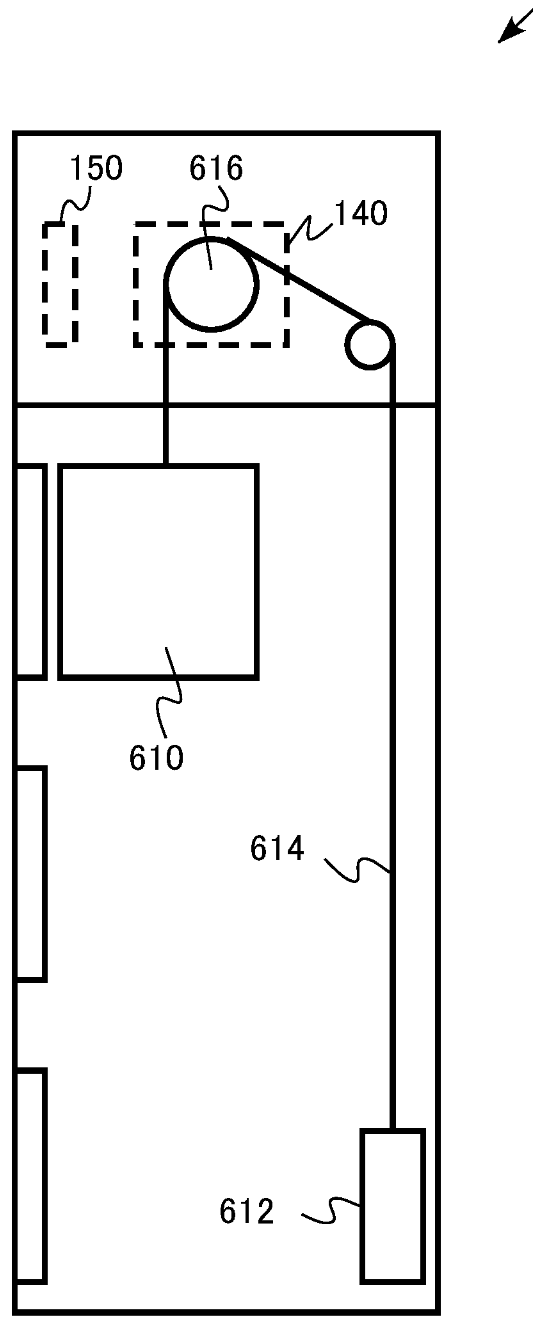
FIG. 19 is a schematic diagram of an elevator according to a ninth embodiment.

FIG. 19 is a schematic diagram of the elevator according to the ninth embodiment. An elevator 1300 according to the ninth embodiment includes a car 610, a counterweight 612, a wire rope 614, a hoisting machine 616, a motor 140, and an inverter circuit 150.

The inverter circuit 150 includes three semiconductor modules having the MOSFET 100 according to the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the ninth embodiment, the characteristics of the elevator 1300 are improved by providing the MOSFET 100 with improved characteristics.

In the first to fifth embodiments, the case of 4H—SiC has been described as an example of the crystal structure of silicon carbide. However, the embodiments can also be applied to silicon carbide having other crystal structures, such as 6H—SiC and 3C—SiC.

In the first to fifth embodiments, a MOSFET has been described as an example of the semiconductor device. However, embodiments can also be applied to an Insulated Gate Bipolar Transistor (IGBT). For example, the IGBT can be realized by replacing a region corresponding to the drain region 50 of the MOSFET 100 from the n type to the p type.

In addition, in the sixth to ninth embodiments, the cases where the semiconductor device according to the first embodiment is provided have been described as examples. However, the semiconductor devices according to the second to fifth embodiments can also be applied.

In addition, in the sixth to ninth embodiments, the cases where the semiconductor devices of embodiments are applied to a vehicle or an elevator have been described as examples. However, the semiconductor devices of embodiments can also be applied to, for example, a power conditioner of a photovoltaic power generation system.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:

a silicon carbide layer having a first face parallel to a first direction and a second direction perpendicular to the first direction and a second face parallel to the first face;

a first trench disposed in the silicon carbide layer, extending in the first direction on the first face, and having a first side surface, a second side surface, and a first bottom surface between the first side surface and the second side surface;

a first gate electrode disposed in the first trench;

a first gate insulating layer disposed between the first gate electrode and the silicon carbide layer;

a second trench disposed in the silicon carbide layer, extending in the first direction on the first face, and having a third side surface facing the second side surface, a fourth side surface, and a second bottom surface between the third side surface and the fourth side surface;

a second gate electrode disposed in the second trench;

a second gate insulating layer disposed between the second gate electrode and the silicon carbide layer;

a third trench disposed in the silicon carbide layer, extending in the first direction on the first face, and having a fifth side surface, a sixth side surface facing the first side surface, and a third bottom surface between the fifth side surface and the sixth side surface, the first trench being disposed between the second trench and the third trench;

a third gate electrode disposed in the third trench;

a third gate insulating layer disposed between the third gate electrode and the silicon carbide layer;

a first silicon carbide region of n-type disposed in the silicon carbide layer;

a second silicon carbide region of p-type disposed in the silicon carbide layer, disposed between the first silicon carbide region and the first face, and disposed between the first trench and the second trench;

a third silicon carbide region of p-type disposed in the silicon carbide layer, disposed between the first silicon carbide region and the first face, and disposed between the first trench and the third trench;

a fourth silicon carbide region of n-type disposed in the silicon carbide layer and disposed between the second silicon carbide region and the first face;

a fifth silicon carbide region of n-type disposed in the silicon carbide layer and disposed between the third silicon carbide region and the first face;

a sixth silicon carbide region of p-type disposed in the silicon carbide layer and disposed between the first silicon carbide region and the first bottom surface;

a seventh silicon carbide region of p-type disposed in the silicon carbide layer and disposed between the first silicon carbide region and the second bottom surface;

an eighth silicon carbide region of p-type disposed in the silicon carbide layer and disposed between the first silicon carbide region and the third bottom surface;

a plurality of ninth silicon carbide regions of p-type disposed in the silicon carbide layer, in contact with the sixth silicon carbide region, in contact with the second silicon carbide region, in contact with the second side surface, and repeatedly arranged in the first direction; and a plurality of tenth silicon carbide regions of p-type disposed in the silicon carbide layer, in contact with the seventh silicon carbide region, in contact with the second silicon carbide region, in contact with the third side surface, and repeatedly arranged in the first direction, wherein, at a first cross section perpendicular to the first face, perpendicular to the first direction, and including one of the ninth silicon carbide regions and one of the tenth silicon carbide regions, the first silicon carbide region is in contact with the first side surface, the first bottom surface, the sixth side surface, and the third bottom surface.

2. The semiconductor device according to claim 1, further comprising:

a plurality of eleventh silicon carbide regions of p-type disposed in the silicon carbide layer, in contact with the sixth silicon carbide region, in contact with the third silicon carbide region, in contact with the first side surface, and repeatedly arranged in the first direction; and a plurality of twelfth silicon carbide regions of p-type disposed in the silicon carbide layer, in contact with the eighth silicon carbide region, in contact with the third silicon carbide region, in contact with the sixth side surface, and repeatedly arranged in the first direction, wherein, at a second cross section parallel to the first cross section, disposed in the first direction with respect to the first cross section, and including one of the eleventh silicon carbide regions and one of the twelfth silicon carbide regions, the first silicon carbide region is in contact with the second side surface and the third side surface.

3. The semiconductor device according to claim 2, wherein the ninth silicon carbide region and the eleventh silicon carbide region are alternately arranged in the first direction.

4. The semiconductor device according to claim 3, wherein a repetition pitch of the ninth silicon carbide regions in the first direction is equal to a repetition pitch of the eleventh silicon carbide regions in the first direction.

5. The semiconductor device according to claim 1, wherein, at the first cross section, the ninth silicon carbide region and the tenth silicon carbide region are in contact with each other.

6. The semiconductor device according to claim 1, wherein, at the first cross section, the sixth silicon carbide region is in contact with the first side surface, and the seventh silicon carbide region is in contact with the fourth side surface.

7. The semiconductor device according to claim 1, wherein a width of the first trench in the second direction is smaller than a distance between the first trench and the second trench.

8. The semiconductor device according to claim 1, wherein a distance between the first trench and the second trench is equal to or less than 2 μm.

9. The semiconductor device according to claim 1, wherein a width of the first trench in the second direction is equal to or less than 1 μm.

10. The semiconductor device according to claim 1, wherein a repetition pitch of the ninth silicon carbide regions in the first direction is equal to or less than 50 times a length of the ninth silicon carbide region in the first direction.

11. The semiconductor device according to claim 4, wherein a half of the repetition pitch of the ninth silicon carbide regions in the first direction is equal to or less than 50 times a length of the ninth silicon carbide region in the first direction.

12. The semiconductor device according to claim 1, wherein a length of the ninth silicon carbide region in the first direction is equal to or more than 0.5 μm and equal to or less than 3 μm.

13. The semiconductor device according to claim 1, wherein a repetition pitch of the ninth silicon carbide regions in the first direction is equal to or more than 5 μm and equal to or less than 100 μm.

14. The semiconductor device according to claim 4, wherein a half of the repetition pitch of the ninth silicon carbide regions in the first direction is equal to or more than 5 μm and equal to or less than 100 μm.

15. An inverter circuit, comprising:
the semiconductor device according to claim 1.

16. A drive device, comprising:
the semiconductor device according to claim 1.

17. A vehicle, comprising:
the semiconductor device according to claim 1.

18. An elevator, comprising:
the semiconductor device according to claim 1.

* * * * *